US006674121B2

(12) United States Patent
Misra et al.

(10) Patent No.: US 6,674,121 B2
(45) Date of Patent: Jan. 6, 2004

(54) METHOD AND SYSTEM FOR MOLECULAR CHARGE STORAGE FIELD EFFECT TRANSISTOR

(75) Inventors: Veena Misra, Raleigh, NC (US); David F. Bocian, Riverside, CA (US); Werner G. Kuhr, Oak Hills, CA (US); Jonathan S. Lindsey, Raleigh, NC (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/017,999

(22) Filed: Dec. 14, 2001

(65) Prior Publication Data
US 2003/0111670 A1 Jun. 19, 2003

(51) Int. Cl.$^7$ ............................................. H01L 29/792
(52) U.S. Cl. ...................................................... 257/324
(58) Field of Search ........................................ 257/324

(56) References Cited

U.S. PATENT DOCUMENTS

| | | | |
|---|---|---|---|
| 5,010,451 A | * 4/1991 | Ueyama et al. | ............. 361/504 |
| 5,153,680 A | * 10/1992 | Naito et al. | ................... 257/40 |
| 5,364,806 A | 11/1994 | Ma et al. | |
| 5,960,270 A | 9/1999 | Misra et al. | |
| 6,128,214 A | 10/2000 | Kuekes et al. | |
| 6,208,553 B1 | 3/2001 | Gryko et al. | |
| 6,212,093 B1 | 4/2001 | Lindsey | |
| 6,255,689 B1 | 7/2001 | Lee | |
| 6,272,038 B1 | 8/2001 | Clausen et al. | |
| 6,281,545 B1 | 8/2001 | Liang et al. | |
| 6,294,428 B1 | 9/2001 | Chen | |
| 6,294,812 B1 | 9/2001 | Ding et al. | |
| 6,303,960 B1 | 10/2001 | Wang et al | |
| 6,324,091 B1 | * 11/2001 | Gryko et al. | ............... 365/151 |
| 6,381,169 B1 | * 4/2002 | Bocian et al. | ............. 365/151 |
| 6,451,942 B1 | * 9/2002 | Li et al. | ..................... 526/258 |

OTHER PUBLICATIONS

Harry R. Allcock, E. Clay Kellam III, Robert V. Morford, "Gel electrolyhtes from co–substituted oligoethyleneoxy/trifluoroethoxy linear polyphosphazenes, " Solid State Ionics, 143 (2001) 297–308.

J. M. Buriak, "Organometallic Chemistry on Silicon Surfaces: Formation of Functional Monolayers Bound Through Si–C Bonds," Chem. Commun. 1999, 1051–1060.

A. Chatterjee et al., "Sub–100 nm gate length metal gate NMOS transistors fabricated by a replacement gate process," IEDM Tech. Dig. 1997, 821–824.

Y. W. Cheng–Yang, J. J. Hwang, F. H. Chang, "Polyphosphazene Electrolytes. 1 Preparation and Conductivities of New polymer electrolytes based ob Poly[bis(amino)phosphazene] and Lithium Perchlorate," Maromolecules, 30 (1997) 3825–3831.

(List continued on next page.)

*Primary Examiner*—Long Pham
*Assistant Examiner*—Howard Weiss
(74) *Attorney, Agent, or Firm*—Stephen J. LeBlanc; Quine Intellectual Property Law Group, P.C.

(57) ABSTRACT

A method and/or system and/or apparatus for a molecular-based FET device (an m-FET) uses charge storing molecules between a gate and channel of an FET-type transistor. Further embodiments describe fabrication methods for using combinations of standard practices in lithography and synthetic chemistry and novel elements.

27 Claims, 5 Drawing Sheets

Electrical Block Diagram of an m-FET

Example block diagram showing use of linker and spacer to alter capacitances and charge imaging in the dipole layer.

OTHER PUBLICATIONS

C. Clausen, D. T. Gryko, A. A. Yasseri, J. R. Diers, D. F. Bocian, W. G. Kuhr, and J. S. Lindsey, "Investigation of Tightly Coupled Porphyrin Arrays Comprised of Identical Monomers for Multibit Information Storage," J. Org. Chem. 2000, 65, 7371–7378.

C. Clausen, D. T. Gryko, R. B. Dabke, N. Dontha, D. F. Bocian, W. G. Kuhr, and J. S. Lindsey "Synthesis of Thiol–Derivatized Porphyrin Dimers and Trimers for Studies of Architectural Effects on Multibit Information Storage," J. Org. Chem. 2000, 65, 7363–7360.

B. Eitan and A. Roy, In Flash Memories, P. Cappalletti, Ed., Kluwer Academic Publishers: Boston, 1999.

Joan Fuller, Amy C. Breda, Richard T. Carlin, "Ionic liquid–polymer gel electrolytes from hydrophilic and hydrophobic ionic liquids," J. of Electroanal. Chem., 459 (1998) 29–34.

D. T. Gryko, C. Clausen, K. M. Roth, N. Dontha, D. F. Bocian, W. G. Kuhr, and J. S. Lindsey "Synthesis of "Porphyrin–Linder–Thiol" Molecules with Diverse Linkers for Studies of Molecular–Based Information Storage," J. Org. Chem. 2000, 65, 7345–7355.

D. T. Gryko, F. Zhao, A. A. Yasseri, K. M. Roth, D. F. Bocian, W. G. Kuhr, and J. S. Lindsey "Synthesis of Thiol–Derivatized Ferocene–Porphyrins for Studies of Multibit Information Storage," J. Org. Chem. 2000, 65, 7356–7362.

D. T. Gryko, P. C. Clausen, and J. S. Lindsey, "Thiol–Derivatized Porphyrins for Attachment to Electroactive Surfaces," J. Org. Chem. 1999, 64, 8635–8647.

D. Gryko, J. Li, J. R. Diers, K. M. Roth, D. F. Bocian, W. G. Kuhr and J. S. Lindsey, "Studies Related to the Design and Synthesis of a Molecular Octal Counter," J. Mater. Chem., 2001, vol. 11, p. 1162–1180.

J. A. Haber, I. Lauermann, D. Michalak, T. P. Vaid, and N. S. Lewis, "Electrochemical and Electrical Behavior of (111)–Oriented Si Surfaces Alkoxylated through Oxidative Activation of Si–H Bonds," J. Phys. Chem. B 2000, 104, 9947–9950.

J. Li, D. Gryko R. B. Dabke, J. R. Diers, D. F. Bocian, W. G. Kuhr, and J. S. Lindsey "Synthesis of Thiol–Derivatized Europium Porphyrinic Triple Decker Sandwich Complexes for Multibit Molecular Information Storage," J. Org. Chem. 2000, 65, 7379–7390.

Akihiro Noda, Masayoshi Watanabe, "Highly conductive polymer electrolytes prepared by in situ polymerization of vinyl monomers in room temperature molten salts," Electrochimica Acta, 45 (2000) 1265–1270.

K. M. Roth, N. Dontha, R. B. Dabke, D. T. Gryko, C. Clausen, J. S. Lindsey, D. F. Bocian, and Werner G. Kuhr, "Molecular Approach toward Information Storage Based on the Redox Properties of Porphyrins in Self–Assembled Monolayers," J. Vac. Sci. Technol. B 2000, 18, 2359–2364.

K. Yano, T. Ishii, T. Sano, T. Mine, F. Murai, T. Hashimoto, T. Kobayashi, T. Kure and K. Seki, "Single–Electron Memory for Giga–to–Tera Bit Storage," Proc. IEEE 1999, 87, 633–651.

H. Yoon, et al., "A 2.5V, 333Mb/s/pin, 1G bit , Double–rate Synchronous DRAM," IEEE J. Solid–State Circuits, 1999, 34, 1589–1598.

* cited by examiner

Electrical Block Diagram of an m-FET

Example block diagram showing use of linker and spacer to alter capacitances and charge imaging in the dipole layer.

Write and erase effect on I-V characteristics of an m–FET (a) linear scale and (b) log scale.

Example band diagrams illustrating write, store, and erase.

Example Fabrication scheme of molecular memory device.

METHOD AND SYSTEM FOR MOLECULAR CHARGE STORAGE FIELD EFFECT TRANSISTOR

STATEMENT AS TO RIGHTS TO INVENTIONS MADE UNDER FEDERALLY SPONSORED RESEARCH AND DEVELOPMENT

This invention was made with government support under Grant Number N00014-99-1-0357 from the Office of Naval Research. The Government of the United States of America may have certain rights in the invention.

FIELD OF THE INVENTION

The present invention relates to electronic circuits and applications and method of manufacture thereof. More specifically, the invention relates to a hybrid transistor circuit incorporating charge storage molecules.

BACKGROUND OF THE INVENTION

The discussion of any work, publications, sales, or activity anywhere in this submission, including in any documents submitted with this application, shall not be taken as an admission by the inventors that any such work constitutes prior art. The discussion of any activity, work, or publication herein is not an admission that such activity, work, or publication was known in any particular jurisdiction.

The great majority of electronic devices in use today employ solid-state transistors as a chief building block. In digital devices, and in many analog devices, these transistors are field-effect transistors (FETs) of various types and used in various configurations.

One important goal in the development of electronic devices is miniaturization. The smaller the individual transistor device, the more complex and powerful the electronic circuit that can be constructed in a given area. However, an alternative to miniaturization is multi-mode operation. Thus, if a transistor with just two state operation is replaced with a transistor with four or eight state operation, even of the same size, again more complex and highly functional circuits can be constructed in a given region.

A further goal in the development of electronic devices is devices that can retain state when power is OFF. This is particularly true for devices such as memory elements used in cell-phones. A device widely used in such appliances is FLASH memory. FLASH memory, as known in the art, commonly employs one or more floating gate FETs to hold charge.

However, there are at least two drawbacks to commonly used FLASH memories. One is that current manufacturing technologies are expected to provide limited ability to shrink memory cells thereby limiting memory density. The other is that many FLASH memory designs require high-power (as much as 15 V) to write to the memory.

Multibit storage has been proposed for various types of FLASH memory cells in order to increase memory density. However, most current approaches have been accompanied by many problems, such as: (1) limited precision in reading, i.e., the inability to detect the current with sufficiently high accuracy and high speed; (2) inaccurate writing, i.e., the inability to place the right amount of charge on the floating gate to obtain the target $V_T$ (threshold voltage) value; (3) unreliability due to lack of maintenance of adequate spacing between adjacent stored levels in a memory cell for sufficiently long time intervals.

In a conventional FLASH, the threshold voltage depends analogically on the amount of charge stored in the floating gate and hence the $I_{DS}$ can be changed over a large range of values. In such devices, if multiple bits are desired, the $\Delta_{IDS}$ between states becomes smaller which in turn makes the sensing and writing prone to errors. To avoid this problem, the $\Delta_{IDS}$ between bits can be increased; however, this is generally at the cost of higher voltages, which can degrade reliability and make devices more difficult to operate.

Single-electron memories have recently been investigated for replacement of DRAM memories. These devices consist of a transistor where small metal or semiconductor islands are placed in the $SiO_2$ matrix. These islands exhibit coulomb blockade oscillations and can therefore be used as multi-value memories. Although several single-electron memory approaches have been reported, they all require that the islands be in the nanoscale regime in order to observe oscillations. Because all the reported devices are fabricated using non-manufacturable shrinking techniques, they all suffer from non-reproducibility, owing to the variation in the island size from device to device. The variation of size, orientation, and charge state may ultimately limit the viability of using single-electron charging for memory applications. Moreover, these single-electron charging devices still require high voltages (generally >15 V) to store multiple levels.

Patent References

Various strategies have been proposed for constructing memory devices using molecular electrical storage elements, among them those discussed in the below indicated patents and other publications:

U.S. Pat. No. 6,272,038; High-density non-volatile memory devices incorporating thiol-derivatized porphyrin trimers U.S. Pat. No. 6,212,093; High-density non-volatile memory devices incorporating sandwich coordination compounds U.S. Pat. No. 6,208,553; High density non-volatile memory device incorporating thiol-derivatized porphyrins.

Strategies and background techniques for using a dummy gate in constructing a semiconductor device are discussed in:

U.S. Pat. No. 5,960,270; Method for forming an MOS transistor having a metallic gate electrode that is formed after the formation of self-aligned source and drain regions.

Charge Storage References

[1] K. M. Roth, N. Dontha, R. B. Dabke, D. T. Gryko, C. Clausen, J. S. Lindsey, D. F. Bocian, and Werner G. Kuhr, "Molecular Approach toward Information Storage Based on the Redox Properties of Porphyrins in Self-Assembled Monolayers," J. Vac. Sci. Technol. B 2000, 18, 2359–2364.

[2] D. T. Gryko, C. Clausen, K. M. Roth, N. Dontha, D. F. Bocian, W. G. Kuhr, and J. S. Lindsey "Synthesis of "Porphyrin-Linker-Thiol" Molecules with Diverse Linkers for Studies of Molecular-Based Information Storage," J. Org. Chem. 2000, 65, 7345–7355.

[3] D. T. Gryko, F. Zhao, A. A. Yasseri, K. M. Roth, D. F. Bocian, W. G. Kuhr, and J. S. Lindsey "Synthesis of Thiol-Derivatized Ferrocene-Porphyrins for Studies of Multibit Information Storage," J. Org. Chem. 2000, 65, 7356–7362.

[4] C. Clausen, D. T. Gryko, R. B. Dabke, N. Dontha, D. F. Bocian, W. G. Kuhr, and J. S. Lindsey, "Synthesis of Thiol-Derivatized Porphyrin Dimers and Trimers for Studies of Architectural Effects on Multibit Information Storage," J. Org. Chem. 2000, 65, 7363–7360.

[5] C. Clausen, D. T. Gryko, A. A. Yasseri, J. R. Diers, D. F. Bocian, W. G. Kuhr, and J. S. Lindsey, "Investigation of Tightly Coupled Porphyrin Arrays Comprised of Identical Monomers for Multibit Information Storage," J. Org. Chem. 2000, 65, 7371–7378.

[6] J. Li, D. Gryko R. B. Dabke, J. R. Diers, D. F. Bocian, W. G. Kuhr, and J. S. Lindsey "Synthesis of Thiol-Derivatized Europium Porphyrinic Triple-Decker Sandwich Complexes for Multibit Molecular Information Storage," J. Org. Chem. 2000, 65, 7379–7390.

[7] D. T. Gryko, P. C. Clausen, and J. S. Lindsey, "Thiol-Derivatized Porphyrins for Attachment to Electroactive Surfaces," J. Org. Chem. 1999, 64, 8635–8647.

[8] D. Gryko, J. Li, J. R. Diers, K. M. Roth, D. F. Bocian, W. G. Kuhr, and J. S. Lindsey, "Studies Related to the Design and Synthesis of a Molecular Octal Counter," J. Mater. Chem., 2001, Vol. 11, p. 1162–1180.

[9] K. M. Roth, J. S. Lindsey, D. F. Bocian, and W. G. Kuhr, "Open Circuit Potential Amperometry and Voltammetry of Surface-Bound Redox-Active Species," Langmuir, submitted.

[10] B. Eitan and A. Roy, In Flash Memories, P. Cappalletti, Ed.; Kluwer Academic Publishers: Boston, 1999.

[11] K. Yano, T. Ishii, T. Sano, T. Mine, F. Murai, T. Hashimoto, T. Kobayashi, T. Kure and K. Seki, "Single-Electron Memory for Giga-to-Tera Bit Storage," Proc. IEEE 1999, 87, 633–651.

[12] Misra et al., U.S. Pat. No. 5,960,270.

[13] A. Chatterjee et al., "Sub-100 nm gate length metal gate NMOS transistors fabricated by a replacement gate process," IEDM Tech. Dig. 1997, 821–824.

[14] J. M. Buriak, "Organometallic Chemistry on Silicon Surfaces: Formation of Functional Monolayers Bound Through Si-C Bonds," Chem. Commun. 1999, 1051–1060.

[15] J. A. Haber, I. Lauermann, D. Michalak, T. P. Vaid, and N. S. Lewis, "Electrochemical and Electrical Behavior of (111)-Oriented Si Surfaces Alkoxylated through Oxidative Activation of Si—H Bonds," J. Phys. Chem. B 2000, 104, 9947–9950.

[16] 1999 International Technology Roadmap for Semiconductors, Semiconductor Industry Association (SIA).

[17] H. Yoon, et al., "A 2.5V, 333 Mb/s/pin, 1G bit, Double-rate Synchronous DRAM," IEEE J. Solid-State Circuits, 1999, 34, 1589–1598.

Gel Electrolyte References

[18] Joan Fuller, Amy C. Breda, Richard T. Carlin, "Ionic liquid-polymer gel electrolytes from hydrophilic and hydrophobic ionic liquids, "J. of Electroanal. Chem., 459 (1998) 29–34.

[19] Akihiro Noda, Masayoshi Watanabe, "Highly conductive polymer electrolytes prepared by in situ polymerization of vinyl monomers in room temperature molten salts," Electrochimica Acta, 45 (2000) 1265–1270.

[20] Harry R. Allcock, E. Clay Kellam III, Robert V. Morford, "Gel electrolytes from co-substituted oligoethyleneoxy/trifluoroethoxy linear polyphosphazenes," Solid State Ionics, 143 (2001) 297–308.

[21] Y. W. Chen-Yang, J. J. Hwang, F. H. Chang, "Polyphosphazene Electrolytes. 1 Preparation and Conductivities of New polymer electrolytes based on Poly[bis (amino)phosphazene] and Lithium Perchlorate," Macromolecules, 30 (1997) 3825–3831.

SUMMARY

The present invention involves a novel hybrid transistor circuit that includes charge storage molecules as described here in the dielectric region of a FET. These storage molecules, in specific embodiments, can be made to hold charge and thus allow a hybrid transistor according to specific embodiments of the present invention to operate analogously to a floating gate FET. This device will at times be referred to herein as a molecular-FET or m-FET.

In further specific embodiments, an m-FET can have molecules that store discrete (or quantized) amounts of charge, thus allowing an m-FET to have multi-state operation.

In further specific embodiments, the invention involves a memory cell that operates similarly to a FLASH-type memory cell. This cell can be based on an m-FET and is referred to at times herein as a molecular-hybrid memory cell.

According to specific embodiments of the invention, a molecular-hybrid memory cell has one or more of the following advantages: (1) low power and/or voltage operation (can be less than about 2V) and/or low power consumption, (2) in specific constructions, allows for multi-valued memory operation due to the discrete states of the molecules, (3) in particular constructions, allows for straightforward fabrication of charge molecules via self-assembly approaches, (4) fault-tolerance through the use of multiple molecules in a given memory device, (5) for DRAM-type devices, charge-retention times of up to several minutes (for example, greater than 1,000 times that of certain semiconductor memories), and (6) scalability down to molecular dimensions.

In specific embodiments, the invention can be used in a memory device that has some operating characteristics analogous to a floating gate Si-MOSFET or a FLASH memory, but with the differences and advantages discussed herein. An Si-MOSFET, as known in the art, generally comprises (1) source, (2) drain, and (3) channel regions, with the channel region separated by (4) a non-conducting layer (e.g., a dielectric layer) from (5) a control gate. Modified MOSFET's, designed for storage of data in some types of FLASH memory are known that include (6) a floating gate between the control gate (which, particularly in floating gate designs is sometimes referred to as a counter electrode) and the channel region, generally embedded in the dielectric layer. In such designs, the floating gate can be injected with current to hold charge after disconnection of the control gate from a voltage or current source.

According to specific embodiments of the present invention, some or all of the dielectric layer of a MOSFET-type device is replaced by molecular components. At a minimum, these components include charge-storage molecule(s) (CSM), e.g., porphyrin(s) or porphyrinic molecule(s) or other charge storage molecule(s) as described herein and in the incorporated references. In certain embodiments, the charge-storage molecule is attached to a substrate via a linker, also termed a channel linker, as described herein and in the incorporated references. In specific embodiments, a control-gate spacer is placed between the distal end (the end furthest away from the channel region) of the charge-storage molecule in order to discourage electron transfer across the control gate-charge-storage molecule interface and to enhance stored charge imaging in the channel region.

In specific embodiments, the charge storage molecules and associated molecules are placed in the dielectric region along with an electrolyte. A control gate is placed over the molecular components.

In certain preferred embodiments, the charge storage molecules comprising the molecular layer of an m-FET are porphyrinic macrocycles, and more preferably are porphyrins. One advantage of porphyrinic macrocycles is the ability to design porphyrinic macrocycles having a plurality of different and distinguishable non-zero oxidation states (charge states), thus allowing multi-state operation in specific embodiments. For example, in an m-FET, multi-valued memory operation can significantly increase memory density.

It will be understood by those of skill in the art that devices constructed according to the teachings provided herein can be made to behave analogously to a floating gate FLASH memory device. A method of operation of such a device according to specific embodiments of the invention proceeds as follows: during a write process, an appropriate voltage is applied to the gate; this voltage oxidizes the molecule(s) (e.g., electron(s) tunnel out) and stores charge on the molecule(s); this stored charge is then used to alter the threshold voltage of the m-FET, e.g., a positive charge on the molecule(s) will result in a negative shift in threshold voltage (in present embodiments, molecules are generally cation-based, although other embodiments are possible in which CSM can hold a negative charge, resulting in a positive shift in threshold voltage); this altered threshold voltage is sensed in order to determine the data stored on the m-FET.

Other Features & Benefits

The invention and various specific aspects and embodiments will be better understood with reference to the following drawings and detailed descriptions. For purposes of clarity, this discussion refers to devices, methods, and concepts in terms of specific examples. However, the invention and aspects thereof may have applications to a variety of types of devices and systems. It is therefore intended that the invention not be limited except as provided in the attached claims.

Furthermore, it is well known in the art that logic systems and methods such as described herein can include a variety of different components and different functions in a modular fashion. Different embodiments of the invention can include different mixtures of elements and functions and may group various functions as parts of various elements. For purposes of clarity, the invention is described in terms of systems that include many different innovative components and innovative combinations of innovative components and known components. No inference should be taken to limit the invention to combinations containing all of the innovative components listed in any illustrative embodiment in this specification.

All references, publications, patents, and patent applications cited herein are hereby incorporated by reference in their entirety for all purposes.

DESCRIPTION OF SPECIFIC EMBODIMENTS

Figure 1:
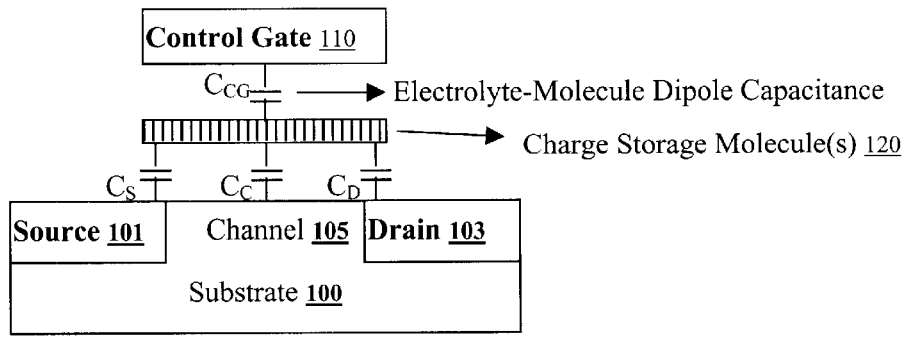
FIG. 1 is a block diagram illustrating components of an example m-FET according to specific embodiments of the invention.

Before describing the present invention in detail, it is to be understood that this invention is not limited to particular compositions or systems, which can, of course, vary. It is also to be understood that the terminology used herein is for the purpose of describing particular embodiments only, and is not intended to be limiting. As used in this specification and the appended claims, the singular forms "a," "an" and "the" include plural referents unless the content and context clearly dictates otherwise. Thus, for example, reference to "a device" includes a combination of two or more such devices, and the like.

Unless defined otherwise, all technical and scientific terms used herein have the same meaning as commonly understood by one of ordinary skill in the art to which the invention pertains. Although any methods and materials similar or equivalent to those described herein can be used in practicing or for testing the present invention, preferred materials and methods are described herein.

In describing and claiming the present invention, the following terminology will be used generally in accordance with the definitions set out below, unless the context requires otherwise.

Definitions

The term "oxidation" refers to the loss of one or more electrons in an element, compound, or chemical substituent/subunit. Conversely the term reduction refers to the gain of one or more electrons by an element, compound, or chemical substituent/subunit.

An "oxidation state" refers to the electrically neutral state or to the state produced by the gain or loss of electrons to an element, compound, or chemical substituent/subunit. In a certain embodiment, the term "oxidation state" refers to states including the neutral state and any state other than a neutral state caused by the gain or loss of electrons (reduction or oxidation).

The term "multiple oxidation states" means more than one oxidation state. In certain embodiments, the oxidation states may reflect the gain of electrons (reduction) or the loss of electrons (oxidation).

The terms "different and distinguishable" when referring to two or more oxidation states means that the net charge on the entity (atom, molecule, aggregate, subunit, etc.) can exist in two different states. The states are said to be "distinguishable" when the difference between the states is greater than thermal energy at room temperature (e.g. 0° C. to about 40° C.).

The term "tightly coupled" when used in reference to a subunit of a multi-subunit (e.g., polymeric) storage molecule of this invention refers to positioning of the subunits relative to each other such that oxidation of one subunit alters the oxidation potential(s) of the other subunit. In a certain embodiment the alteration is sufficient such that the (non-neutral) oxidation state(s) of the second subunit are different and distinguishable from the non-neutral oxidation states of the first subunit. In a certain embodiment the tight coupling is achieved by a covalent bond (e.g. single, double, triple, etc.). However, in certain embodiments, the tight coupling can be through a linker, via an ionic interaction, via a hydrophobic interaction, through coordination of a metal, or by simple mechanical juxtaposition. It is understood that the subunits could be so tightly coupled that the redox processes are those of a single supermolecule.

The term "electrically coupled" when used with reference to a charge storage molecule and substrate refers to an association between that molecule and a substrate such that electrons move between a storage molecule and the substrate in response to an applied signal or field and thereby alter the oxidation state of the storage molecule. Electrical coupling can include direct covalent linkage, indirect covalent coupling (e.g. via a linker), direct or indirect ionic bonding, or other bonding (e.g. hydrophobic bonding). In addition, no actual bonding may be required and the storage medium/molecule may simply be contacted with the channel surface. There also need not necessarily be any contact between the electrode/channel and the storage medium/molecule where the electrode or gate is sufficiently close to the storage medium/molecule so that a field applied will cause an oxidation reaction of the charge storage molecule.

The term "redox-active unit" or "redox-active subunit" refers to a molecule or component of a molecule that is capable of being oxidized or reduced by the application of a suitable voltage. The term "redox-active" molecule refers to a molecule or component of a molecule that is capable of being oxidized or reduced by the application of a suitable voltage.

The term "subunit," as used herein, refers to a redox-active component of a molecule.

The terms "charge storage molecule" or" storage molecule" refer to a molecule having one or more oxidation states that can be used for the storage of information (e.g. a molecule comprising one or more redox-active subunits).

The term "charge storage molecules" or "storage molecules" refers to a composition comprising two or more storage molecules. The "charge storage molecules" or "storage molecules" can contain only one species of storage molecule or it can contain two or more different species of storage molecule. The multiplicity of different and distinguishable oxidation states can be produced by the combination of different species of storage molecules, each species contributing to said multiplicity of different oxidation states and each species having a single non-neutral oxidation state. Alternatively or in addition, "charge storage molecules" or "storage molecules" can comprise one or more species of storage molecule having a multiplicity of non-neutral oxidation states. The "charge storage molecules" or "storage molecules" can contain predominantly one species of storage molecule or it can contain a number of different storage molecules. The "charge storage molecules" or "storage molecules" can also include associated components such as molecules other than storage molecules (e.g. to provide chemical stability, suitable mechanical properties, to prevent charge leakage, etc.).

The terms "read" or "interrogate" refer to the determination of the oxidation state(s) of one or more molecules (e.g. molecules comprising a storage medium).

The term "$E_{1/2}$" refers to the practical definition of the formal potential (E°) of a redox process as defined by $E = E° + (RT/nF)\ln(D_{ox}/D_{red})$ where R is the gas constant, T is temperature in K (Kelvin), n is the number of electrons involved in the process, F is the Faraday constant (96,485 Coulomb/mole), $D_{ox}$ is the diffusion coefficient of the oxidized species and $D_{red}$ is the diffusion coefficient of the reduced species.

The term "porphyrinic macrocycle" refers to a porphyrin or porphyrin derivative. Such derivatives include porphyrins with extra rings ortho-fused, or ortho-perifused, to the porphyrin nucleus, porphyrins having a replacement of one or more carbon atoms of the porphyrin ring by an atom of another element (skeletal replacement), derivatives having a replacement of a nitrogen atom of the porphyrin ring by an atom of another element (skeletal replacement of nitrogen), derivatives having substituents other than hydrogen located at the peripheral (meso-, β-) or core atoms of the porphyrin, derivatives with saturation of one or more bonds of the porphyrin (hydroporphyrins, e.g., chlorins, bacteriochlorins, isobacteriochlorins, decahydroporphyrins, corphins, pyrrocorphins, etc.), derivatives obtained by coordination of one or more metals to one or more porphyrin atoms (metalloporphyrins), derivatives having one or more atoms, including pyrrolic and pyrromethenyl units, inserted in the porphyrin ring (expanded porphyrins), derivatives having one or more groups removed from the porphyrin ring (contracted porphyrins, e.g., corrin, corrole) and combinations of the foregoing derivatives (e.g. phthalocyanines, sub-phthalocyanines, and porphyrin isomers). Porphyrinic macrocycles also include triple-decker sandwich complexes as well as oligomers of sandwich complexes. Preferred porphyrinic macrocycles comprise at least one 5-membered ring.

The term "porphyrin" refers to a cyclic structure typically composed of four pyrrole rings together with four nitrogen atoms and two replaceable hydrogens for which various metal atoms can readily be substituted. A typical porphyrin is hemin.

The term "multiporphyrin array" refers to a discrete number of two or more covalently linked porphyrinic macrocycles. The multiporphyrin arrays can be linear, cyclic, or branched.

The terms "sandwich coordination compound" or "sandwich coordination complex" refer to a compound of the formula $L_nM^{n-1}$, where each L is a heterocyclic ligand (as described below), each M is a metal, n is 2 or more, most preferably 2 or 3, and each metal is positioned between a pair of ligands and bonded to one or more heteroatom (and typically a plurality of heteroatoms, e.g., 2, 3, 4, 5) in each ligand (depending upon the oxidation state of the metal). Thus sandwich coordination compounds are not organometallic compounds such as ferrocene, in which the metal is bonded to carbon atoms. The ligands in the sandwich coordination compound are generally arranged in a stacked orientation (i.e., are generally cofacially oriented and axially aligned with one another, although they may or may not be rotated about that axis with respect to one another) (see, e.g., Ng and Jiang (1997) *Chemical Society Reviews* 26:

433–442). Sandwich coordination complexes include, but are not limited to "double-decker sandwich coordination compounds" and "triple-decker sandwich coordination compounds". The synthesis and use of sandwich coordination compounds is described in detail in U.S. Pat. No. 6,212,093 B1.

The term "double-decker sandwich coordination compound" refers to a sandwich coordination compound as described above where n is 2, thus having the formula $L^1$—$M^1$—$L^2$, wherein each of $L^1$ and $L^2$ may be the same or different (see, e.g., Jiang et al. (1999) *J. Porphyrins Phthalocyanines* 3: 322–328).

The term "triple-decker sandwich coordination compound" refers to a sandwich coordination compound as described above where n is 3, thus having the formula $L^1$—$M^1$—$L^2$—$M^2$—$L^3$, wherein each of $L^1$, $L^2$ and $L^3$ may be the same or different, and $M^1$ and $M^2$ may be the same or different (see, e.g., Arnold et al. (1999) *Chemistry Letters* 483–484).

A "linker" is a molecule used to couple two different molecules, two subunits of a molecule, or a molecule to a substrate.

A "substrate" is a, preferably solid, material suitable for the attachment of one or more molecules. Substrates can be formed of materials including, but not limited to glass, plastic, silicon, germanium, minerals (e.g. quartz), semiconducting materials (e.g. doped silicon, doped germanium, etc.), ceramics, metals, etc.

The term "aryl" refers to a compound whose molecules have the ring structure characteristic of benzene, naphthalene, phenanthrene, anthracene, etc. (i.e., either the 6-carbon ring of benzene or the condensed 6-carbon rings of the other aromatic derivatives). For example, an aryl group may be phenyl (e.g., $C_6H_5$) or naphthyl (e.g., $C_{10}H_7$). It is recognized that the aryl, while acting as substituent can itself have additional substituents (e.g. the substituents provided for $S^n$ in the various Formulas herein).

The term "alkyl" refers to a paraffinic hydrocarbon group which may be derived from an alkane by dropping one hydrogen from the formula. Examples are methyl ($CH_3$—), ethyl ($C_2H_5$—), propyl ($CH_3CH_2CH_2$—), isopropyl (($CH_3)_2$CH—).

The term "halogen" refers to one or the electronegative elements of group VIIA of the periodic table (fluorine, chlorine, bromine, iodine, astatine).

The term "nitro" refers to the $NO_2$ group.

The term "amino" refers to the $NH_2$ group.

The term "perfluoroalkyl" refers to an alkyl group where every hydrogen atom is replaced with a fluorine atom.

The term "perfluoroaryl" refers to an aryl group where every hydrogen atom is replaced with a fluorine atom.

The term "pyridyl" refers to an aryl group where one CH unit is replaced with a nitrogen atom.

The term "cyano" refers to the —CN group.

The term "thiocyanato" refers to the —SCN group.

The term "sulfoxyl" refers to a group of composition RS(O)— where R is some alkyl, aryl, cycloalkyl, perfluoroalkyl, or perfluoroaryl group. Examples include, but are not limited to methylsulfoxyl, phenylsulfoxyl, etc.

The term "sulfonyl" refers to a group of composition $RSO_2$— where R is some alkyl, aryl, cycloalkyl, perfluoroalkyl, or perfluoroaryl group. Examples include, but are not limited to methylsulfonyl, phenylsulfonyl, p-toluenesulfonyl, etc.

The term "carbamoyl" refers to the group of composition $R(R^2)NC(O)$— where $R^1$ and $R^2$ are H or some alkyl, aryl, cycloalkyl, perfluoroalkyl, or perfluoroaryl group. Examples include, but are not limited to N-ethylcarbamoyl, N,N-dimethylcarbamoyl, etc The term "amido" refers to the group of composition $R^1CON(R^2)$— where $R^1$ and $R^2$ are H or some alkyl, aryl, cycloalkyl, perfluoroalkyl, or perfluoroaryl group. Examples include, but are not limited to acetamido, N-ethylbenzamido, etc.

The term "acyl" refers to an organic acid group in which the OH of the carboxyl group is replaced by some other substituent (RCO—). Examples include, but are not limited to acetyl, benzoyl, etc.

In certain embodiments, when a metal is designated by "M" or "$M^n$", where n is an integer, it is recognized that the metal may be associated with a counterion.

The term "substituent" as used in the formulas herein, particularly designated by S or $S^n$ where n is an integer, in a certain embodiment refer to groups (subunits) that can be used to adjust the redox potential(s) of the subject compound. Preferred substituents include, but are not limited to, aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, amido, and carbamoyl. In certain embodiments, a substituted aryl group is attached to a porphyrin or a porphyrinic macrocycle, and the substituents on the aryl group are selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, amido, and carbamoyl.

Particularly preferred substituents include, but are not limited to, 4-chlorophenyl, 3-acetamidophenyl, 2,6-dichloro-4-trifluoromethyl. Preferred substituents provide a redox potential range of less than about 5 volts, preferably less than about 2 volts, more preferably less than about 1 volt.

The phrase "provide a redox potential range of less than about X volts" refers to the fact that when a substituent providing such a redox potential range is incorporated into a compound, the compound into which it is incorporated has an oxidation potential less than or equal to X volts, where X is a numeric value.

Overview

This invention involves a novel hybrid flash memory device. At times referred to herein as an m-FET, the device operates similarly to a field effect transistor (FET). According to specific embodiments of the present invention, an m-FET is basically an FET, with one or more species of charge storage molecule(s) (CSM) arranged in the dielectric region so that charge can be stored on or removed from the CSM by an electric field applied at the control gate. According to specific embodiments of the present invention, charge storage molecules can store charge in one or more discrete oxidation states, allowing for multi-level operation. According to specific embodiments of the present invention, charge stored in the CSM can then be easily detected by measuring a source drain current ($I_{SD}$) flowing through the transistor, analogous to detection in a FLASH memory.

An m-FET made according to certain specific embodiments of the invention is hybrid in nature—comprising elements fabricated using traditional solid state assembly (e.g. lithography) and methods of synthetic chemistry, e.g., to create the charge-storage material. In specific example embodiments, low power, dense memory storage can include a charge storage material comprising a monolayer of redox-active molecules attached to an electroactive surface as discussed in references cited above.

In specific embodiments, multiple bits of information can be stored through the use of redox-active molecules that afford one or more of distinct oxidation states. Writing/reading information in the molecules in specific embodiments can be done electrically at room temperature.

For single-bit operation, an m-FET according to specific embodiments of the invention can be used in a memory architecture similar to a conventional floating-gate FLASH memory, but with a lower write voltage needed than for conventional FLASH memory.

For multibit operation, reading can be accomplished by various methods, such as detecting $I_{DS}$ and/or $V_{DS}$ and/or $V_{GS}$ at different levels. Various architectures can be used to allow multi-bit reading from a single m-FET.

For multibit operation, writing can be accomplished by various methods, such as applying different gate voltages ($V_{GS}$). Various architectures can be used to allow multi-bit writing to a single m-FET memory cell.

Thus, according to specific embodiments of the invention, porphyrinic macrocycles are used as charge storage molecules in hybrid CMOS/molecular multi-value memories. Porphyrinic macrocycles offer distinct advantages over many other materials including (a) discrete oxidation states at room temperature, (b) low-voltage operation to access all states (<about 2 V), (c) robust and reproducible self-assembly on suitable substrates, and (d) discrete charge-storing capabilities. According to specific embodiments of the invention, these features afford facile write/read operations that realize multilevel memory storage.

According to certain embodiments of the present invention, other elements can be included in an m-FET to improve operation. In certain embodiments, a linker is used to provide physical attachment and/or a desired electrical path between CSM and a substrate containing a channel. Materials and properties of an optional linker are discussed further below. Further, in certain embodiments, a spacer is used to provide physical and/or electrical separation between a control gate and the CSM. Materials and properties of an optional spacer are discussed further below. Further, in certain embodiments, an electrolyte is in contact with CSM and allows electrons to flow between the CSM and substrate under certain conditions. Materials and properties of an optional electrolyte are discussed further below.

Charge Density Analysis demonstrate that CSM as described herein and in cited references are suitable for use in an m-FET according to specific embodiments of the present invention, consider charge densities achievable with such molecules. For example, given that an individual porphyrin molecule occupies an area of ~100 Å$^2$, these CSMs have a minimum charge density of ~1.6×10$^{-5}$ C·cm$^{-2}$ (for singly oxidized molecules). This density can be easily detected using a transistor with 100 nm length and width. The equation governing this mechanism is shown below:

$$\Delta V_T = -\frac{\overline{Q}}{C_{CG}}$$

where $V_T$ is the threshold voltage, $\Delta V_T$ is the change in $V_T$ imposed by charge on the CSM, $\overline{Q}$ is the charge stored on the molecules, and $C_{CG}$ is the capacitance between the molecules and the electrolyte. As can be seen from this expression, to increase the change in threshold voltage ($\Delta V_T$) requires the capacitance of the dipole layer ($C_{CG}$) to be decreased. As discussed above, according to specific embodiments of the invention, this can be achieved by incorporating a suitable control gate spacer into an m-FET according to specific embodiments of the present invention. This spacer is arranged at the side of the CSM side distal to the channel surface. According to specific embodiments of the present invention, such a control gate spacer causes the counter-ions in the electrolyte to be separated from the charged memory storage molecules. Note that a change in threshold voltage arising from a typical control gate spacer is around 0.18 V (thickness=1 nm, dielectric constant=10). This value is easily detectable in an m-FET according to specific embodiments of the present invention.

Example m-FET Architecture

Figure 2:
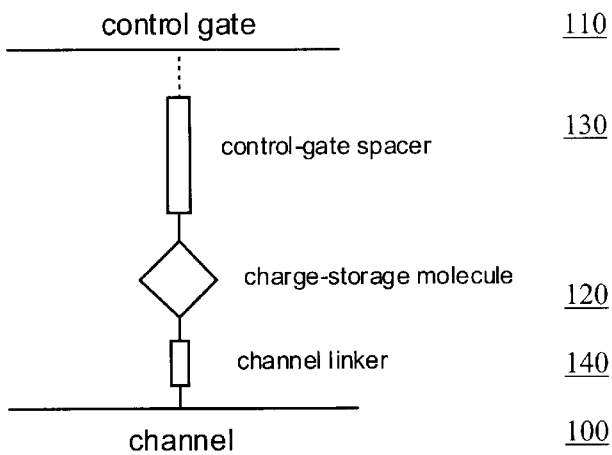
FIG. 2 is a block diagram illustrating components of an example m-FET according to specific embodiments of the invention, and showing optional components.

FIG. 1 is a block diagram illustrating components of an example m-FET according to specific embodiments of the invention. FIG. 2 is a block diagram illustrating components of an example m-FET according to specific embodiments of the invention, and showing optional components.

It will be apparent to those of skill in the art that FIG. 1 and FIG. 2 can be understood to represent solid-state electrical devices, such as transistors and/or memory elements, fabricated on a hybrid integrated circuit. Alternatively, FIG. 1 and FIG. 2 can be understood to represent operational components and/or characteristics of an m-FET as described herein, without indicating the specific physical orientation or layout of active components. As is well known in the art of solid-state design, the physical layout of a solid state circuit can be widely varied for specific applications, even while maintaining the same basic circuit operation. The present invention encompasses the novel methods of circuit operation herein described and claimed and that can be embodied in a variety of specific physical circuit architectures.

To facilitate description, an m-FET at times herein will be described in terms of having a basic vertical orientation, with a "top" defined as the control gate/counter electrode and a bottom defined as the channel region. It will be understood to those of skill in the art that devices according to specific embodiments of the present invention can have a variety of physical realizations, including realizations that have different physical orientations from that shown.

FIG. 1 is a block diagram illustrating components of an example m-FET according to specific embodiments of the invention. As will be understood to those of skill in the art, the illustrated devices represents a type of field effect transistor (FET), having a substrate 100, with a source region 101, a drain region 103, and a channel region 105. In a standard FET, a control gate/counter electrode such as 110 is placed near the channel region such that an electric field at the control gate will have an effect on current flow between the source and the drain. Fabrication of such components can be accomplished by a variety of processes that are well known to practitioners in the art, such as photo-lithography, deposition, electron-beam, etc. Thus any number of different known methods for constructing these elements can be employed in different embodiments of the invention.

According to specific embodiments of the present invention, one or more charge-storage molecules 120 is placed between gate 110 and channel 105. According to specific embodiments of the present invention, these charge storage molecules operate so that an electric potential at the control gate 110 will cause charge to be stored at CSM 120.

When this electric potential is removed, the charge will remain on CSM 120. According to specific embodiments of the present invention, charge stored at CSM 120 will affect the conductance of the channel region 105 and can thereby be detected by applying a signal across channel region 105, e.g., between source 101 and drain 103.

It will be understood to those of skill in the art that a range of materials can be used for a substrate according to specific embodiments of the invention, such as, for example, Si, Ge, SiC, Ga, Au, Ag, Cu, Al, Ta, Ti, Ru, Ir, Pt, Pd, Os, Mn, Hf, Zr, V, Nb, La, Y, Gd, Sr, Ba, Cs, Cr, Co, Ni, Zn, Ga, In, Cd, Rh, Re, their oxides, and their nitrides. A control gate (also referred to as a counter electrode) is placed near (e.g. above) the charge storage molecule(s).

Basic Read and Write Operation

According to specific embodiments of the invention, a device such as that illustrated in FIG. 1, behaves similarly to a FLASH memory device. During the write process, a voltage is applied to control gate 110. This voltage oxidizes CSM 120 (for example, electron(s) tunnels into the channel region) and stores charge on the molecule. According to specific embodiments of the invention, the charge storage molecules have discrete oxidation states (e.g. energy states) and when the energy level of one of the discrete states resonates with the Si Fermi level or any lower level, the electron(s) tunnel out into the channel region. The resulting delocalized net charge can thus alter the threshold voltage of the m-FET, e.g. a positive charge on the molecules will result in a negative shift in threshold voltage and a negative charge on the molecules will result in a positive shift in threshold voltage. Once the charge storage molecules are charged, disconnecting the terminals of the m-FET from a voltage source results in a field distribution in the cell that depends on the initial written state (relaxation of the cell).

During a read operation, in specific embodiments, the control gate is subjected to a small gate bias ($V_{CG}$) and the $I_{DS}$ current obtained is used to determine the charge state of the device.

Example V-T Characteristics for Write and Erase

Figure 3:
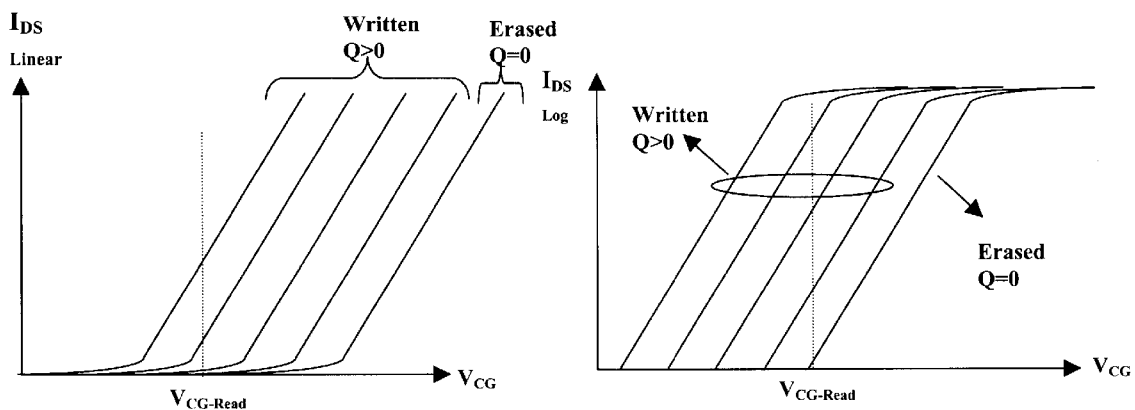
FIG. 3 illustrates write and erase effects on I-V characteristics of an m-FET according to specific embodiments of the invention with (a) drawn in linear scale and (b) drawn in log scale.

FIG. 3 illustrates write and erase effects on I-V characteristics of an m-FET according to specific embodiments of the invention with (a) drawn in linear scale and (b) drawn in log scale. Electrical characteristics of an m-FET according to specific embodiments of the invention will be further understood with reference to this figure. The five curves shown on the left and the five curves shown on the right each indicate distinct data states in multi-bit operation. In each side, the right most curve represents an erase state or zero state.

In this particular example construction, as illustrated in the figure, if the device is written (e.g., charge is stored in the molecules), a relatively larger transistor current ($I_{DS}$) will be obtained at a given gate voltage ($V_{CG}$). When the device is erased (no stored charge in the molecules), a smaller $I_{DS}$ current will result at a given gate voltage ($V_{CG}$). Note that, as is generally the case in FLASH devices, in the low-current range, small changes in voltage result in large changes in current, such as 5–6 orders of magnitude. Thus, this current can be easily sensed during a read operation.

Because the read operation is achieved by sensing, reading in this architecture can be significantly faster than writing, as writing requires net electron transfer with the molecular storage element. In addition, a device according to specific embodiments of the invention can operate under low power due to low oxidation potentials of the redox-active and/or porphyrin-based molecules. During the erase process, an appropriate reducing voltage is placed on the control gate that results in an electron tunneling into the molecules, thereby neutralizing the positive charge.

Charge Retention

The charge-retention time of an m-FET according to specific embodiments of the present invention generally depends on the stability of stored charge in the charge storage molecules and/or the barrier to electron transfer from the charge storage molecules. The barrier to electron transfer is largely determined by the electrical coupling of the charge storage molecule(s) to the underlying substrate. Where the charge storage molecules are coupled to the substrate through a linker, the electrical coupling is affected by the height of the energy barrier of the linker and the linker physical dimensions (particular the vertical length) because these impact the electron tunneling characteristics.

Channel Linker and Control-Gate Spacer

FIG. 2 is a block diagram illustrating components of an example m-FET according to specific embodiments of the invention, and showing optional components. This figure further illustrates a spacer 130 and a linker 140. In embodiments in which they are present, the control gate spacer and the channel linker have a number of functions. Both act as a screening medium for the charge stored in the CSM. Because the path through the channel linker is typically shorter (e.g., from the CSM to the channel) than the control-gate spacer, more of the charge stored in the charge storage molecule(s) is imaged onto the channel, resulting in greater modulation of the channel threshold voltage.

Spacer

For an m-FET according to specific embodiments to operate efficiently, it is generally desirable that most of the charge stored on the charge storage molecules be imaged onto the channel region, so that the stored charge will have a maximum effect on $V_T$. The magnitude of this effect generally depends on the distance of the charge from the upper electrode (control gate) and the lower electrode (channel). In order to increase this distance, one or more spacers such as 130 can be incorporated according to specific embodiments of the present invention. While the presence of a spacer can increase the oxidation potential by a small amount, the required write voltage will still generally be considerably less than FLASH memories, for example, that require>about 15 V.

According to various embodiments, the control-gate spacer can be chemically attached to the charge-storage molecule, to the control gate, or to both the charge-storage molecule and the control gate. The spacer can also be physically placed between the charge-storage molecule and the control gate without any chemical attachment. Typical control-gate spacers can be comprised of oligomers/polymers of low dielectric materials (e.g., $\epsilon$<15), and if attached to the control gate, can include a suitable functional group for attachment to the surface of the material comprising the control gate.

Thus, in specific embodiments, the use of a control-gate spacer at the distal side of CSM provides a means of shielding the charge on the CSM (cationic) from the compensating charges (anionic) in the electrolyte. The extent of shielding can be altered by synthetic design; groups of different size, polarity, and extension from the molecular-charge storage entities can be employed. The ability to shift the average displacement of the compensating charge provides a means of modulating the parameters of the read process.

When present, the insulating properties of a control gate spacer suppress electron tunneling between the control gate and charge storage molecules. Accordingly, electron tunneling occurs preferentially between the charge storage molecules and the channel. The control-gate spacer can also be used to facilitate fabrication wherein the spacer is designed to allow a control gate (electrolyte or metal) to be placed on top of the spacer.

When present, it is generally desired that the spacer be a dielectric with a relatively high capacitance. According to specific embodiments of the present invention, the high capacitance can be achieved by: a) thinning down the control gate spacer, b) using a high dielectric constant control gate spacer, c) increasing the area of the control gate spacer, or d) combining two or more approaches. In (a) it should be noted that the thickness of the control gate spacer should not be so thin that charge can easily leak through, e.g. between the control gate and the CSM. In approach (c), increasing the area of the control gate spacer can increase the cell size, which in some applications may be undesirable.

Linker

As discussed herein and in the cited references, in specific embodiments, it is desirable to provide a linker, such as 140, between the CSM and the channel. Various linker compositions and chemical properties are discussed further below and in the references. When used in an m-FET according to specific embodiments of the present invention, the linker provides a further area that allows for optimization of the electrical characteristics of an m-FET. Thus, according to specific embodiments of the present invention, desired performance of an m-FET can be achieved by selection of a linker to provide a desired energy barrier and physical dimensions to achieve desired tradeoffs between charge retention time and write characteristics, generally as will be understood in the art with respect to the design of floating gate devices. The channel linker is generally chosen such that electron transfer will occur between the charge-storage molecule and the channel when an appropriate write voltage is placed on the gate, while minimizing charge leakage.

As will be understood to those with skill in the art, the linker energy barrier height is given by the energy difference between the highest occupied molecular orbital (HOMO) and the lowest unoccupied molecular orbital (LUMO) of the linker. The barrier width is given by the physical vertical length of the linker. The energy barrier width and height can be altered in a systematic way by choosing linkers of various physical lengths, and of composition giving a desired HOMO-LUMO gap. Thus, an alkyl linker can be chosen of approximately the same length as an oligo-p-phenylene linker; the latter would have a lower energy barrier height than the former. According to specific embodiments of the present invention, to achieve optimization, various molecules can be synthesized and tested for performance and this cycle can be iterated to achieve desired optimized performance.

Selecting Linker and Spacer Properties

In specific architectures according to specific embodiments of the present invention, the charge retention, write/read times and magnitude of threshold voltage change are affected by the physical dimensions and/or electrical properties and/or chemical composition of the channel linker and/or the control-gate spacer. Thus, in specific embodiments, it is preferable to make the channel linker a good tunneling medium and the control gate spacer a good insulating medium. According to specific embodiments of the present invention, the channel linker is typically shorter in terms of its electrical path to the charge storage molecules than the control gate spacer. A taller control-gate spacer and a short channel linker enables the maximum modulation of the channel threshold voltage. The properties of both the control-gate spacer and the channel linker can be tuned synthetically by modulating the molecular composition and physical dimensions of each.

Capacitive Coupling

According to specific embodiments of the present invention, one method for selecting desirable properties of the spacer and linker is by considering the capacitances of the interfaces in an m-FET. Returning to FIG. 1, the figure illustrates, as will be understood in the art, that CSM in the dielectric region of an m-FET are generally capacitively coupled to the control gate and/or to the underlying substrate.

The total capacitance at the CSM, $C_{TOT}$, of the device is the sum of all the parallel capacitances that are connected to the CSM components of the device. Thus, the total capacitance is given by: $C_{TOT}=C_{CG}(C_C+C_S+C_D)/(C_{CG}+C_CC_S+C_D)$, where $C_C$ is the capacitance between the channel and the CSM, $C_S$ and $C_D$ are the source/drain overlap capacitances, and CCG is the capacitance between the charge storage molecules and the control gate.

Consider the case when no charge is stored on the charge storage molecules. This can be expressed, $Q_{CSM}=0=C_{CG}*(V_{CSM}-V_G)+C_S*(V_{CSM}-V_S)+C_D*(V_{CSM}-V_D)$, where $V_G$, $V_S$ and $V_D$ are the potentials applied to the gate, source and drain, respectively. If the substrate bias, and drain and source bias are assumed to be zero, one can ignore the capacitance from $C_C$ and $C_{FOX}$ (The field oxide capacitance from the CSM to the isolation oxide). Therefore, the CSM voltage can be determined indirectly by the various terminal voltages: $V_{CSM}=V_G*GCR+V_S*SCR+V_D*DCR$, where GCR is the control gate coupling ratio ($C_{CG}/C_{TOT}$), SCR is the source-coupling ratio ($C_S/C_{TOT}$) and DCR is the drain-coupling ratio ($C_D/C_{TOT}$).

According to specific embodiments of the present invention, it is generally preferred that the GCR coupling ratio is as high as possible so that most of the applied gate voltage appears on the charge storage molecules, thereby reducing necessary programming voltages and increasing programming efficiency. In specific embodiments, to achieve this, a control gate spacer with a high capacitance can be employed, as further discussed below. Generally, it is desirable to have GCR ~0.8 which roughly translates to a control gate spacer capacitance that is ~4X or higher than the channel linker capacitance.

Furthermore, according to specific embodiments, the length of the channel linker is preferably less than about 100 nm, more preferably less than about 10 nm, and even more preferably less than about 2 nm. The physical vertical length of the control-gate spacer is several times that of the channel linker and can be as long as several hundred nanometers.

Example Energy Band Diagram

Figure 4:
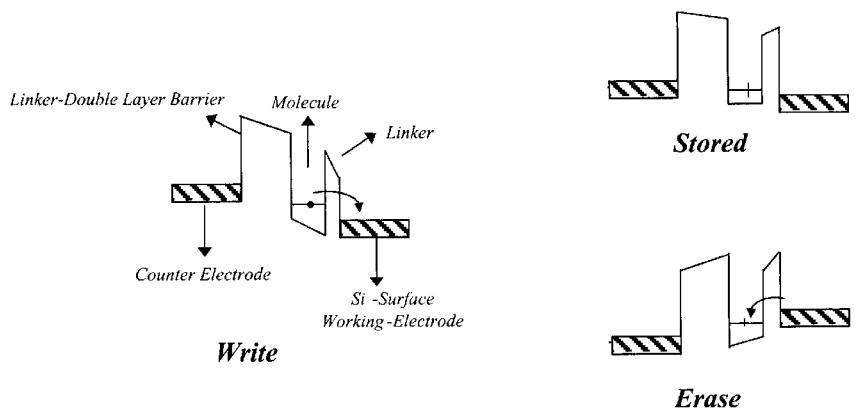
FIG. 4 illustrates band diagrams showing write, store, and erase energy levels of an m-FET according to specific embodiments of the present invention.

An example energy band diagram depicting write, store and erase mechanisms is shown in FIG. 4. In terms of the band diagram, the application of an appropriate voltage on the counter (gate) electrode causes the energy levels of the charged molecules to resonate with the channel material (such as Si) Fermi, level allowing electrons to tunnel into the charge storage molecules.

As shown in the figure, the hashed region indicates the Fermi level. During a write operation, when a negative voltage (compare to the substrate) is applied at the gate, this results in tunneling of electrons from the CSM to the channel. When the gate voltage is removed, this charge remains in the CSM and the energy bands are as shown in the figure for the stored state.

During an erase operation, a positive gate voltage is applied, cause electrons to tunnel from the channel region to the CSM, reducing the charge stored at the CSM.

While a conventional floating gate memory is sometime susceptible to over erasure, where excess charge in the opposite direction from the stored charge is forced onto the floating gate, use of CSMs as discussed herein in an m-FET according to specific embodiments of the present invention eliminates the possibility of overerasure, because CSMs as discussed herein generally will not store charge of the opposite polarity from that which the CSMs are designed.

EXAMPLE M-FET FABRICATION

Because porphyrin molecules and other molecules that may be desirable to use as CSM generally cannot be subjected to high temperatures, the invention in further embodiments provides a fabrication scheme such that high temperature steps occur prior to placement of CSM, which can then be performed at lower temperatures.

Figure 5:
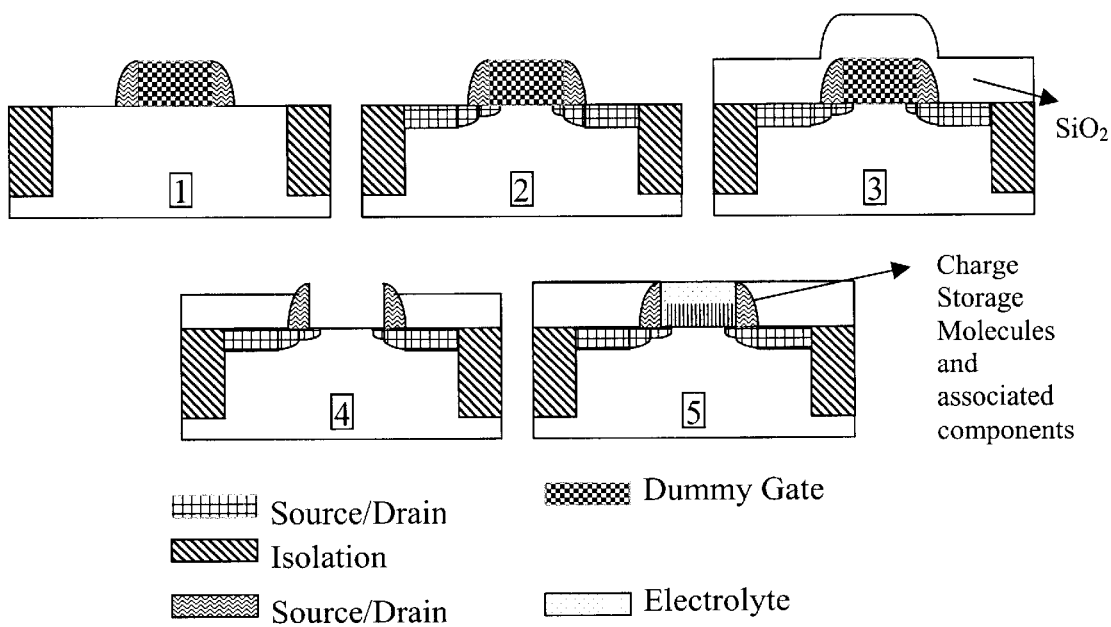
FIG. 5 illustrates steps in an example method for fabricating an m-FET according to specific embodiments of the invention.
Figure 6:
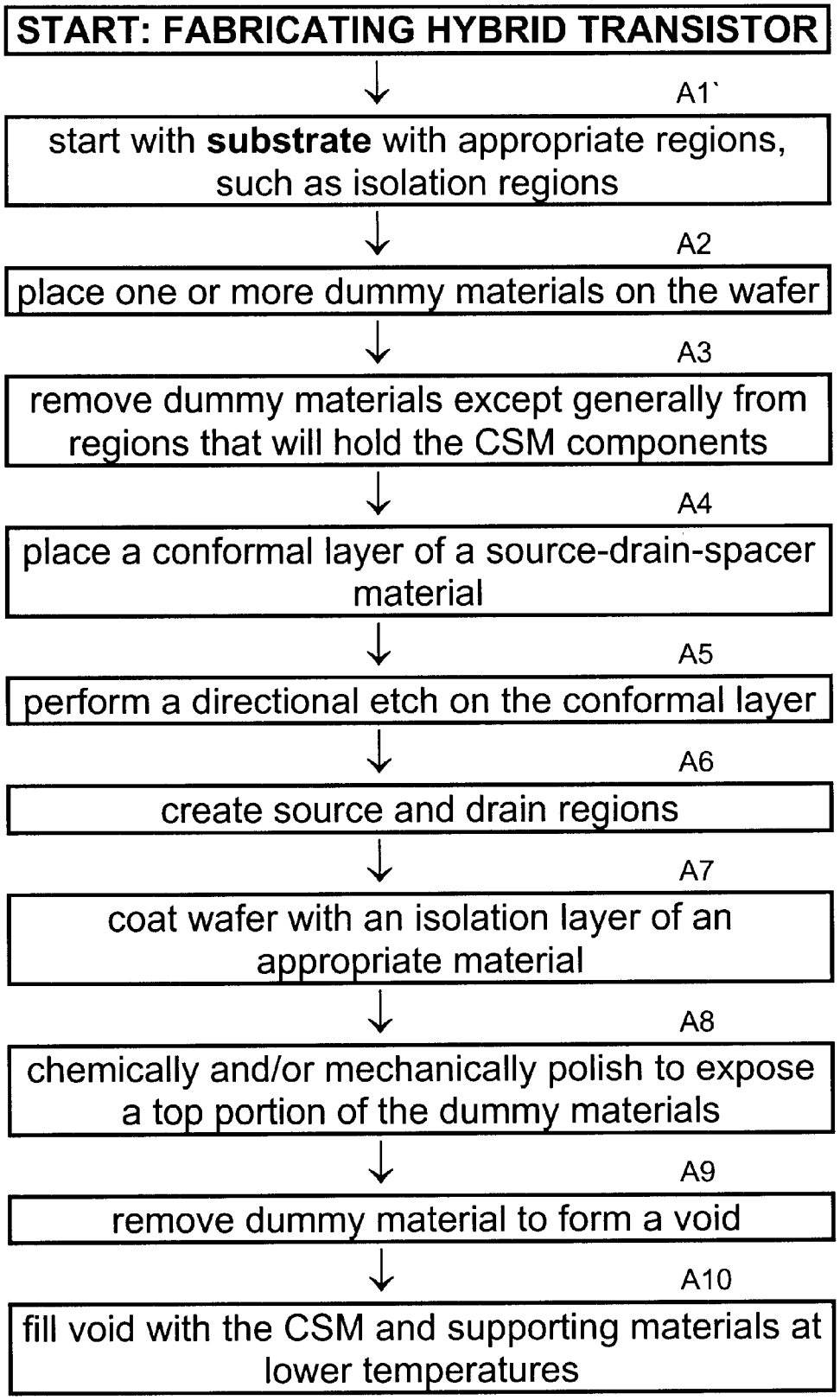
FIG. 6 is a flowchart of an example method for fabricating an m-FET according to specific embodiments of the invention.

FIG. 5 illustrates steps in an example method for fabricating an m-FET according to specific embodiments of the invention. In order to provide a complete description, most of the chief fabrication steps in this example are described. It will be understood to those of skill in the art that variations in fabrication are possible, and in specific embodiments, the fabrications steps for the CSM components provided in this example can be adapted to other fabrication processes. FIG. 6 is a flowchart of an example method for fabricating an m-FET according to specific embodiments of the invention.

According to this example, fabrication proceeds as follows. A substrate with appropriate regions, such as isolation regions, is formed (Step A1). The substrate can be one of many suitable materials, as discussed above, with Si being a very common substrate material. Isolation regions are formed using any appropriate fabrication techniques, such as shallow trench isolation, or locos isolation. Optionally, as will be understood in the art, part of all of the substrate can be doped to change the inherent threshold voltage ($V_T$) of the final device. Typically, as is understood in the art, a device is formed on a wafer of substrate material, simultaneously with thousands or millions of similar or identical devices.

According to specific embodiments of the present invention, next, typically one or more dummy materials are placed on the wafer. These materials are referred to as "dummy" materials, because their function is to remain in place until most or all high-temperature steps are performed. The dummy materials are then removed, and the resulting voids are used for assembly of CSM components. According to specific embodiments of the present invention, two dummy materials are used, a thin dummy dielectric material followed by a thicker dummy gate material. In specific embodiments these materials are deposited and/or grown over the wafer (Step A2). In specific embodiments, the separate, generally thin, dummy dielectric material is placed first in order to protect the substrate during the removal of the dummy gate material.

The wafer is then etched using standard techniques, such as photolithography, to remove the dummy materials in all areas except the region that will hold the CSM components (Step A3). Then a conformal layer (i.e., generally a layer that coats horizontal and vertical surfaces in nearly the same thickness) of a source-drain-spacer material is placed over the area (Step A4). A directional etch (such as an isotropic etch) is performed (Step A5) to remove, for example, only the horizontal portions of this source-drain-spacer material. These steps result in a structure like that illustrated in FIG. 5-1.

Source and drain regions are then be created using standard fabrication techniques, such as ion implantation (Step A6). As will be understood in the art, the areas of source-drain-spacer material control how much the source and drain regions extend under the dummy gate area. These steps result in a structure like that illustrated in FIG. 5-2.

The wafer is then coated with a think isolation layer of an appropriate material, such as $SiO_2$ (Step A7), resulting in a structure like that illustrated in FIG. 5-3. The wafer is then chemically and/or mechanically polished to expose a top portion of the dummy gate (Step A8). The dummy gate and dummy dielectric are then removed to form a void, using a process such as a selective wet etch (Step A9), resulting in a structure as illustrated in FIG. 5-4.

At this point, the void can be filled with the CSM and supporting materials at lower temperatures, as discussed elsewhere herein and in the cited references. The previous steps generally result in the transistor that is ready for attachment of the CSM and any associated components. After, for example, performing an HF dip to remove native oxide, the CSM are placed in the void area (Step A10). As discussed elsewhere herein and in the references, the CSM are designed to be self assembling is that they are drawn selectively to the channel region and position themselves in the correct orientation due to properties of the CSM and channel region. In certain embodiments, prior to attachment, the CSM are attached to a linker and/or spacer as discussed herein.

Generally, an electrolyte material in also placed in the void region. The electrolyte generally provides a conductive path to the CSM. In specific embodiments, washing and/or polishing are performed to remove any CSM or electrolyte from undesired regions.

Control gate metal or other materials can be optionally deposited to provide contact with the electrolyte and contacts to the source/drain may be made in specific embodiments (Step A11). Thus, according to specific embodiments of the present invention, high temperature steps are performed prior to placement of the CSM.

Further Fabrication Details

CSM according to specific embodiments of the invention are attached to the substrate to form a monolayer, using any appropriate process, such as those described in cited references. As discussed in these references, given the constraints of the CSM and chip fabrication schemes, hydroxyalkyl linkers are attractive for attachment to hydrogen-passivated Si or to similar substrates. On Si, linkers can include such compounds as hydroxyalkyl, hydroxyaryl, mercaptoalkyl, mercaptoaryl, selenylalkyl, selenylaryl, tellurylalkyl, tellurylaryl.

Gel/Electrolyte Control Gate and Spacer

Both the control gate spacer and the control gate can be constructed using several different approaches. One approach is to deposit gel/electrolyte on top of assembled CSM, with the interface between the electrolyte and the molecules providing a double layer capacitance that acts as the control gate spacer. The ions in the electrolyte play the role of the control gate. The material character and thickness of the gel/electrolyte system can be optimized to the voltages at which electron transfer (reading/writing) and/or charge retention (charge storage) occurs. This medium is typically composed of a solvent containing an electrolyte and may contain a polymer to increase the viscosity. The medium is prepared by dissolving the electrolyte (typically 1.0 M or less of one of the following: tetrabutylammonium hexafluorophosphate (TBAH), $LiPF_6$, $LiClO_4$, $LiBF_4$) in a solvent (such as propylene carbonate, sulfolane, 3-methyl-2-oxazolidinone, 4-methyl-2-pentanone). The viscosity of the medium is controlled by adding a high molecular weight polymeric material (such as Poly(vinylidene fluoride)-hexafluoropropylene (PVdF(HFP)), 2-hydroxyethyl methacrylate (HEMA), acrylonitrile, methyl methacrylate, poly (ethylene oxide) (PEO), polyphosphazenes). Alternatively, an ionic liquid can replace the solvent/electrolyte medium. Typical ionic liquids include 1-ethyl-3-methyl imidazolium tetrafluoroborate, 1-ethyl-3-methyl imidazolium triflate ($CF_3SO_3$), 1-(1-butyl)-3-methylimidazolium hexafluorophosphate, 1-butylpyridinium tetrafluoroborate. The polymer can also be added to the ionic liquid to control its viscosity.

After the charge storage molecules and gel/electrolyte are in place, the gate electrode is deposited and defined using lithography. All steps following the molecular placement are performed at low temperature to not disturb the integrity of the molecules. Devices with varying widths and channel lengths can be fabricated to allow for varying gate-coupling ratios.

Another approach for obtaining a control-gate spacer and a control gate according to specific embodiments of the present invention is to use distal groups that are attached to the end of the CSM away from when the CSM interfaces with the channel and/or channel linker. In such an embodiment, after placement of CSM with attached distal groups, a control gate (e.g., metal) deposition is performed over the dielectric region.

Both NMOS and PMOS devices can be utilized for multibit memory. The magnitude of $V_T$ shifts to smaller values in NMOS devices and towards larger values in PMOS devices, which can affect read sensitivity.

Benchmarking Hybrid CMOS/Molecular Memory

The molecular-based information storage approach described herein can be embodied as ultra-high density storage ($10^{11}$ bits/$cm^2$ or equivalently 30 nm×30 nm/bit with binary storage cell). In further embodiments, a memory cell according to specific embodiments of the invention allows for multibit storage. In order to achieve a density of $10^{11}$ bits/$cm^2$, each cell occupies an area of about 51 nm×51 nm or less if a single cell is capable of holding three bits.

In specific example embodiments, molecules are linked to the channel region of the transistor, which can limit the size of each cell. In further embodiments, the layout of a memory cell can be made very dense by running a word line (connected to the gate region(s)) horizontally, one vertical bit line (connected to the drain region(s)), and another vertical line shared by two neighboring source regions.

CHEMISTRY

A) Charge Storage Molecules

As explained above, the m-FET devices of this invention comprise a charge storage molecule. Preferred charge storage molecules comprise redox-active molecules having at least one non-zero oxidation state.

Certain preferred redox-active molecules suitable for use in this invention are characterized by having a multiplicity of oxidation states. Those oxidation states are typically provided by one or more redox-active units. A redox-active unit refers to a molecule or to a subunit of a molecule that has one or more discrete oxidation states that can be set by application of an appropriate voltage. Thus, for example, in one embodiment, the redox-active molecule can comprise two or more (e.g. 8) different and distinguishable oxidation states. Typically, but not necessarily, such multi-state molecules will be composed of several redox-active units (e.g. porphyrins or ferrocenes). Each redox-active molecule is itself at least one redox-active unit, or comprises at least one redox-active unit, but can easily comprise two or more redox-active units.

The use of charge storage molecules having multiple non-zero oxidation states allows for multibit storage. In certain embodiments, the invention thus allows a small $V_T$ distribution per state with discrete changes in $I_{DS}$ using charge storage molecules that can store multiple charges in discrete states at low voltages. Thus, according to specific embodiments, the invention achieves greatly enhanced accuracy of writing and reading even for multi-bit memory devices.

Preferred redox-active molecules include, but are not limited to porphyrinic macrocycles. The term "porphyrinic macrocycle" refers to a porphyrin or porphyrin derivative. Such derivatives include porphyrins with extra rings ortho-fused, or ortho-perifused, to the porphyrin nucleus, porphyrins having a replacement of one or more carbon atoms of the porphyrin ring by an atom of another element (skeletal replacement), derivatives having a replacement of a nitrogen atom of the porphyrin ring by an atom of another element (skeletal replacement of nitrogen), derivatives having substituents other than hydrogen located at the peripheral (meso-, β-) or core atoms of the porphyrin, derivatives with saturation of one or more bonds of the porphyrin (hydroporphyrins, e.g., chlorins, bacteriochlorins, isobacteriochlorins, decahydroporphyrins, corphins, pyrrocorphins, etc.), derivatives obtained by coordination of one or more metals to one or more porphyrin atoms (metalloporphyrins), derivatives having one or more atoms, including pyrrolic and pyrromethenyl units, inserted in the porphyrin ring (expanded porphyrins), derivatives having one or more groups removed from the porphyrin ring (contracted porphyrins, e.g., corrin, corrole) and combinations of the foregoing derivatives (e.g. phthalocyanines, sub-phthalocyanines, and porphyrin isomers). Preferred porphyrinic macrocycles comprise at least one 5-membered ring.

Particularly preferred redox-active molecules include a porphyrin, an expanded porphyrin, a contracted porphyrin, a ferrocene, a linear porphyrin polymer, a porphyrin sandwich coordination complex including porphyrin and phthalocyanine ligands, and a porphyrin array.

In one certain embodiment, the redox-active molecule is a metallocene as shown in Formula I.

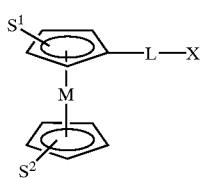

I where L is a linker, X is selected from the group consisting of a substrate, a reactive site that can covalently couple to a substrate (e.g., an alcohol, a thiol, a selenol, a tellurol, an isonitrile, a nitrile, an amine, a carboxylic acid, a phosphonic acid, a silyl trichloride, a trialkoxysilane), M is a metal (e.g., Fe, Ru, Os, Co, Ni, Ti, Nb, Mn, Re, V, Cr, W), $S^1$ and $S^2$ are substituents independently selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl. In certain embodiments, a substituted aryl group is attached to the metallocene, and the substituents on the aryl group are selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl.

Particularly preferred substituents include, but are not limited to, 4-chlorophenyl, 3-acetamidophenyl, 2,6-dichloro-4-trifluoromethyl. Preferred substituents provide a redox potential range of less than about 2 volts.

The oxidation state of molecules of Formula I is determined by the metal and the substituents. Thus, particular certain embodiments are illustrated by Formulas II–VII, (listed sequentially) below:

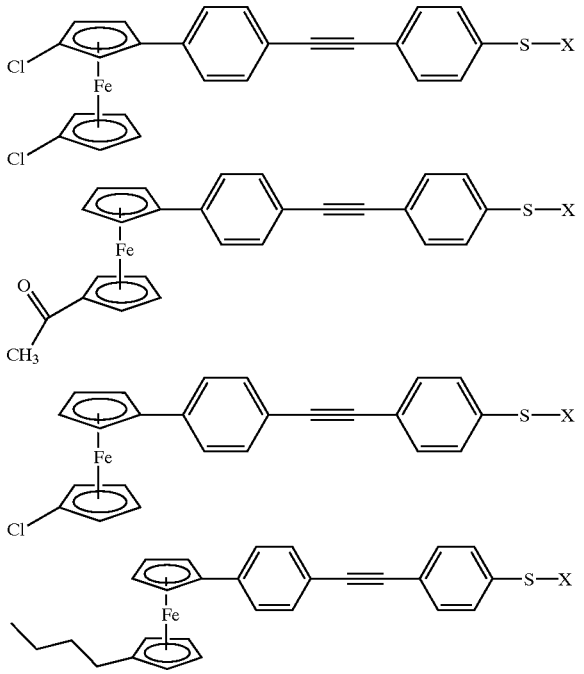

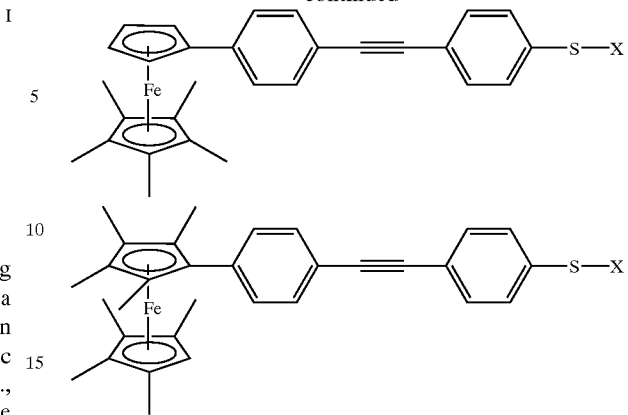

The ferrocenes listed above in Formulas II through VII provide a convenient series of molecules having each having a different and distinguishable non-zero oxidation state. Thus the molecules of Formulas II through VII have oxidation states ($E_{1/2}$) of +0.55 V, +0.48V, +0.39 V, +0.17 V, −0.05 V, and −0.18 V, respectively, and provide a convenient series of molecules for use as the charge storage molecule(s) in the m-FETs of this invention. It will be appreciated that the oxidation potentials of the members of the series can be routinely altered by changing the metal (e.g., M in Formula I) or the substituents.

The charge storage molecules comprising an m-FET of this invention are not limited to a single species of charge storage molecule. Thus, in certain embodiments, a single m-FET can comprise two or more different charge storage molecules. Thus, for example where multiple oxidation states are desired, an m-FET can comprise two or more of the metallocenes described above, or a metallocene and another redox-active molecule, and/or a combination of other redox-active molecules.

Another preferred redox-active molecule is a porphyrin illustrated by Formula VIII.

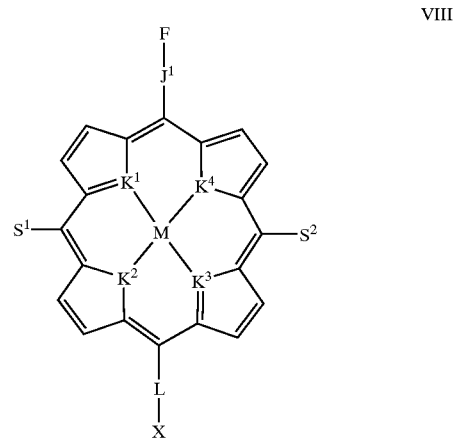

VIII where, F is a redox-active subunit (eg., a ferrocene, a substituted ferrocene, a metalloporphyrin, or a metallochlorin, etc.), $J^1$ is a linker, M is a metal (e.g., Zn, Fe, Mg, Cd, Hg, Cu, Ag, Au, Ni, Pd, Pt, Co, Rh, Ir, Mn, B, Al, Ga, Pb, and Sn), $S^1$ and $S^2$ are independently selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl wherein said substituents provide a redox potential range of less than about 2 volts, $K^1$, $K^2$, $K^3$, and $K^4$ are independently selected from the group consisting of N, O, S, Se, Te, and CH; L is a linker; X is selected from the group consisting of a substrate, a reactive site that can covalently couple to a substrate, and a reactive site that can ionically couple to a substrate (e.g., an alcohol, a thiol, a selenol, a tellurol, an isonitrile, a nitrile, an amine, a carboxylic acid, a phosphonic acid, a silyl trichloride, a trialkoxysilane). In certain embodiments, X or L—X is an alcohol or a thiol. In some embodiments L—X can be eliminated and replaced with a substituent independently selected from the same group as $S^1$ or $S^2$.

In certain specific embodiments, triple-decker lanthanide sandwich molecules comprised of porphyrinic ligands are employed. These molecules are good charge storage molecules due to their large number of redox states, reversible electrochemistry, and relatively low oxidation potentials. The triple-deckers generally exhibit four oxidation states in the range –0.2 to 1.6 V (vs Ag/Ag+), corresponding to the formation of the monocation, dication, trication, and tetracation. A further desirable characteristic of this class of molecules stems from the possibility of interleaving the potentials of two triple-deckers, thereby achieving as many as eight accessible cationic oxidation states.

Control over the charge storage and, where present or desired, hole-hopping properties of the redox-active units of the redox-active molecules used in the memory devices of this invention allows fine control over the performance characteristics of an m-FET of this invention.

Such control is exercised through synthetic design. The charge-storage properties depend on the oxidation potential of the redox-active units or subunits that are used to assemble the m-FETs of this invention. The redox potential, and where desired, the hole-storage properties, can be tuned with precision by choice of base molecule(s), associated metals and peripheral substituents (Yang et al. (1999) *J. Porphyrins Phthalocyanines,* 3: 117–147).

For example, in the case of porphyrins, Mg porphyrins are more easily oxidized than Zn porphyrins, and electron withdrawing or electron releasing aryl groups can modulate the oxidation properties in predictable ways. Hole-hopping occurs among isoenergetic porphyrins in a nanostructure and is mediated via the covalent linker joining the porphyrins (Seth et al. (1994) *J. Am. Chem. Soc.,* 116: 10578–10592, Seth et al (1996) *J. Am. Chem. Soc.,* 118: 11194–11207, Strachan et al. (1997) *J. Am. Chem. Soc.,* 119: 11191–11201; Li et al. (1997) *J. Mater. Chem.,* 7: 1245–1262, Strachan et al. (1998) *Inorg. Chem.,* 37: 1191–1201, Yang et al. (1999) *J. Am. Chem. Soc.,* 121: 4008–4018).

The design of compounds with predicted redox potentials is well known to those of ordinary skill in the art. In general, the oxidation potentials of redox-active units or subunits are well known to those of skill in the art and can be looked up (see, e.g., *Handbook of Electrochemistry of the Elements*). Moreover, in general, the effects of various substituents on the redox potentials of a molecule are generally additive. Thus, a theoretical oxidation potential can be readily predicted for any potential data storage molecule. The actual oxidation potential, particularly the oxidation potential of the information storage molecule(s) or the information storage medium can be measured according to standard methods. Typically the oxidation potential is predicted by comparison of the experimentally determined oxidation potential of a base molecule and that of a base molecule bearing one substituent in order to determine the shift in potential due to that particular substituent. The sum of such substituent-dependent potential shifts for the respective substituents then gives the predicted oxidation potential.

Various preferred redox-active molecules and the syntheses thereof are described in detail in U.S. Pat. Nos. 6,272,038, 6,212,093, and 6,208,553 and PCT Publication WO 01/03126.

B) Linkers

As explained above, in certain embodiments, the charge storage molecule is coupled to the substrate (typically the substrate comprising the channel) in a manner that permits electrons to move from the charge storage medium to the channel or from the channel to the charge storage medium.

The charge storage molecules can simply be juxtaposed to the substrate comprising the channel or they can be coupled (covalently, ionically, hydrophobically, etc.), directly or indirectly through a linker, to the substrate material comprising the channel.

In certain embodiments, a "linker" is used to attach the molecule(s) to the substrate. The linker can be electrically conductive or it can be short enough that electrons can pass directly or indirectly between the charge storage material and the channel.

The manner of linking a wide variety of compounds to various surfaces is well known and is amply illustrated in the literature. Means of coupling the molecules will be recognized by those of skill in the art. The linkage of the storage medium to a surface can be covalent, or by ionic or other non-covalent interactions. The surface and/or the molecule(s) may be specifically derivatized to provide convenient linking groups (e.g., an alcohol, a thiol, a selenol, a tellurol, an isocyanide, a nitrile, an amine, a carboxylic acid, a phosphonic acid, a silyl trichloride, a trialkoxysilane).

Selection of the linker can alter/tune the charge retention properties of the m-FET. In particular, leakage of charge from the charge storage material will be determined by the energy barrier to electron flow into or out of the channel and the distance electrons must travel. Where the charge storage material is attached to the substrate through a linker, the choice of linker will affect both energy barrier and distance, the latter, typically being controlled by the length of the linker.

In the following discussion, it should be understood that that L—X (e.g., as used in the formulas shown above) refer to the channel linker and not the control-gate spacer.) In certain instances, L—X can be replaced with another substituent (S3) like $S^1$ or $S^2$.

In certain embodiments, L—X can be present or absent, and when present can be selected from one or more of the following:

4-hydroxyphenyl, 4-(2-(4-hydroxyphenyl)ethynyl) phenyl, 4-(hydroxymethyl)phenyl, 10-hydroxydecyl, 3-hydroxyphenyl, 3-(2-(4-hydroxyphenyl)ethynyl) phenyl, 3-(hydroxymethyl)phenyl;

4-mercaptophenyl, 4-(2-(4-mercaptophenyl)ethynyl) phenyl, 4-(mercaptomethyl)phenyl, 10-mercaptodecyl, 3-mercaptophenyl, 3-(2-(4-mercaptophenyl)ethynyl) phenyl, 3-(mercaptomethyl)phenyl; 4-selenylphenyl, 4-(2-(4-selenylphenyl)ethynyl)phenyl, 4-(selenylmethyl)phenyl, 10-selenyldecyl, 3-selenylphenyl, 3-(2-(4-selenylphenyl)ethynyl) phenyl, 3-(selenylmethyl)phenyl;

4-tellurylphenyl, 4-(2-(4-tellurylphenyl)ethynyl)phenyl, 4-(tellurylmethyl)phenyl, 10-telluryldecyl, 3-tellurylphenyl, 3-(2-(4-tellurylphenyl)ethynyl) phenyl, 3-(tellurylmethyl)phenyl; 4-cyanophenyl, 4-(2-(4-cyanophenyl)ethynyl)phenyl, 4-(cyanomethyl)

phenyl, 10-cyanononyl, 3-cyanophenyl, 3-(2-(4-cyanophenyl)ethynyl)phenyl, 3-(cyanomethyl)phenyl; 4-isocyanophenyl, 4-(2-(4-isocyanophenyl)ethynyl) phenyl, 4-(isocyanomethyl)phenyl, 10-isocyanononyl, 3-isocyanophenyl, 3-(2-(4-isocyanophenyl)ethynyl) phenyl, 3-(isocyanomethyl)phenyl; 4-carboxyphenyl, 4-(2-(4-carboxyphenyl)ethynyl)phenyl, 4-(carboxymethyl)phenyl, 10-carboxynonyl, 3-carboxyphenyl, 3-(2-(4-carboxyphenyl)ethynyl) phenyl, 3-(carboxymethyl)phenyl;

4-aminophenyl, 4-(2-(4-aminophenyl)ethynyl)phenyl, 4-(aminomethyl)phenyl, 10-aminodecyl, 3-aminophenyl, 3-(2-(4-aminophenyl)ethynyl)phenyl, 3-(aminomethyl)phenyl;

4-(dihydroxyphosphoryl)phenyl, 4-(2-(4-(dihydroxyphosphoryl)phenyl)ethynyl)phenyl, 4-(dihydroxyphosphorylmethyl)phenyl, 10-dihydroxyphosphoryldecyl, 3-(dihydroxyphosphoryl)phenyl, 3-(2-(4-(dihydroxyphosphoryl)phenyl)ethynyl)phenyl, 3-(dihydroxyphosphorylmethyl)phenyl;

4-(trichlorosilyl)phenyl, 4-(2-(4-(trichlorosilyl)phenyl) ethynyl)phenyl, 4-((trichlorosilyl)methyl)phenyl, 10-(trichlorosilyl)decyl, 3-(trichlorosilyl)phenyl, 3-(2-(4-(trichlorosilyl)phenyl)ethynyl)phenyl, 3-((trichlorosilyl)methyl)phenyl;

4-(trimethoxysilyl)phenyl, 4-(2-(4-(trimethoxysilyl) phenyl)ethynyl)phenyl, 4-((trimethoxysilyl)methyl) phenyl, 10-(trimethoxysilyl)decyl, 3-(trimethoxysilyl) phenyl, 3-(2-(4-(trimethoxysilyl)phenyl)ethynyl) phenyl, and 3-((trimethoxysilyl)methyl)phenyl.

In certain embodiments of the present invention, typical channel linkers include, but are not limited to, 4,4'-diphenylethyne, 4,4'-diphenylbutadiyne, 4,4'-biphenyl, 1,4-phenylene, 4,4'-stilbene, 1,4-bicyclooctane, 4,4'-azobenzene, 4,4'-benzylideneaniline, and 4,4"-terphenyl, each of which can bear a suitable functional group for attachment to the surface of the material comprising the channel.

The linker can be provided as a component of the molecule(s) (e.g., as shown by —L—X— in the formulas above) or separately. Linkers, when not joined to the molecules to be linked are often either hetero- or homo-bifunctional molecules that contain two or more reactive sites that may each form a covalent bond with the respective binding partner (i.e. surface or redox-active molecule). When provided as a component of the molecule to be attached, or attached to a substrate surface, the linkers are preferably spacers having one or more reactive sites suitable for bonding to the respective surface or molecule.

Linkers suitable for joining molecules are well known to those of skill in the art and include, but are not limited to any of a variety of, a straight or branched chain carbon linker, or a heterocyclic carbon linker, amino acid or peptide linkers, and the like. Particularly preferred linkers include, but are not limited to 4,4'-diphenylethyne, 4,4'-diphenylbutadiyne, 4,4'-biphenyl, 1,4-phenylene, 4,4'-stilbene, 1,4-bicyclooctane, 4,4'-azobenzene, 4,4'-benzylideneaniline, and 4,4"-terphenyl. Linkers include molecules that join one or more molecules of the storage medium to the electrode(s).

In certain embodiments, the molecules (e.g. charge storage molecules etc.) are used that self-assemble on the substrate. Thus, for example, where the substrate comprises a gold surface, molecules bearing thiol groups or bearing linkers having thiol groups will self-assemble on the gold surface.

Where the substrate comprises a group IV element (e.g. silicon, germanium, etc.) the charge storage molecules are readily coupled to the surface if provided with either a thiol group or an alcohol or with a linker comprising a thiol group or an alcohol. Methods of coupling a molecule comprising an alcohol or a thiol to a group IV element are described in copending application U.S. Ser. No. 10/040,059, entitled FORMATION OF SELF-ASSEMBLED MONOLAYERS ON SILICON SUBSTRATES, filed on Oct. 26, 2001. Basically, the method involves halogenating the group IV element surface; providing a solution comprising the molecule to be coupled to the surface where the alcohol-terminated (e.g., terminated with an alcohol selected from the group consisting of a primary alcohol, a secondary alcohol, a tertiary alcohol, a benzyl alcohol, and an aryl alcohol) or thiol-terminated (e.g., a primary thiol, a secondary thiol, a tertiary thiol, a benzyl thiol, an arylthiol, etc.) molecule is present in a solvent and said alcohol-terminated organic molecule is in a solvent (e.g., mesitylene, durene, o-dichlorobenzene, 1,2,4,-trichlorobenzene, 1-chloronaphthalene, 2-chloronaphthalene, N,N-dimethylformamide, N,N-dimethylacetamide, N,N-dimethylpropionamide, benzonitrile, anisole, etc.); and contacting the solution with the group IV element surface under conditions where the solvent is rapidly removed from the surface whereby the organic molecule is coupled to said surface through an E—O— or an E—S— bond where E is the group IV element (e.g. silicon, germanium, doped silicon, doped germanium, etc.). The reaction is preferably performed in the presence of a base (e.g. 2,4,6-collidine, 2,6-lutidine, 2,6-di-tert-butylpyridine, 4-dimethylaminopyridine, trimethylamine, triethylamine, tributylamine, N,N-diisopropylethylamine, 1,8-bis (dimethylamino)naphthalene, 1,5-diazabicyclo[4.3.0]non-5-ene, 1,8-diazabicyclo[5.4.0]undec-7-ene, $Na_2CO_3$, $NH_3$, etc.). Typically the surface is heated to a temperature of at least about 70° C.

Using the teachings provided herein, other methods of coupling a charge storage molecule to the desired substrate will be routinely implemented by one of skill in the art C) Control-Gate Spacer Material In certain embodiments, the mFETs of this invention additionally comprise a control gate spacer material disposed between the charge storage molecule(s) and the mFET gate. The control gate material can be coupled (e.g. ionically, covalently, hydrophobically, etc.) to the charge storage material or can simply be juxtaposed to or disposed around the charge storage material. Preferred control gate spacer materials comprise low dielectric materials (e.g. having a dielectric constant between about 2 and about 20, more preferably between about 2 and about 10 and most preferably between about 2 and about 5). Typical low dielectric components employed to create the control-gate spacers include, but are not limited to, polypeptides, oligomers of [2.2.2]-bicyclooctane, staffanes, end-capped polymers such as polyethylene, polyethylene glycol, polymethyl methacrylate, and so forth.

In certain embodiments, the control gate spacers comprise bulky (non-polymeric) groups. Preferred bulky groups have a minimum length of greater than about 10 Å, more preferably greater than about 50 Å, and most preferably greater than about 100 Å. Typical control gate spacers have a minimum molecular weight greater than about 0.5 kDA, more preferably greater than about 1 kDA, and most preferably greater than about 5 kDA. A wide variety of relatively insulating materials can be used to compose the control-gate spacer.

SYSTEM EMBODIMENTS

Use of the Storage Device in Computer Systems

Figure 7:
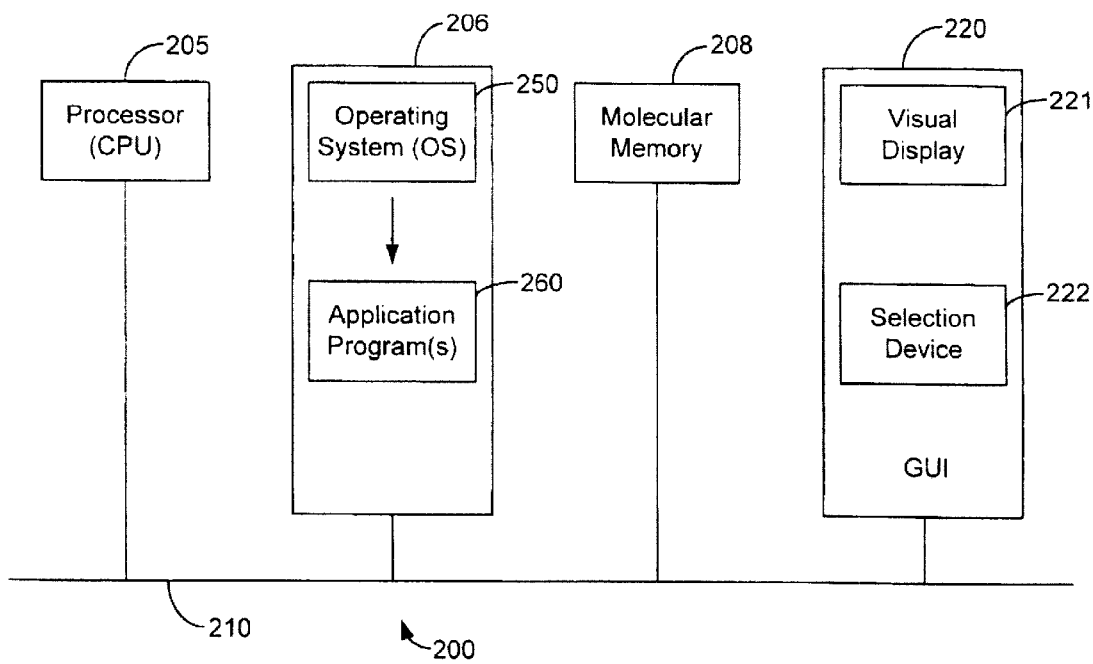
FIG. 7 illustrates the memory devices of this invention integrated into a standard computer architecture or computer system.

The use of the storage devices of this invention in computer systems is contemplated. One such computer system is illustrated in FIG. 7. The computer comprises a signal source (e.g. I/O device or CPU) a storage device of this invention and appropriate circuitry (e.g. voltammetry circuitry) to read the state(s) of the storage device. In operation, voltages representing the bits to be stored are applied to the working electrodes of the storage device thereby setting the memory. When retrieval is necessary (e.g. for output, or further processing) the state(s) of the storage device is read by the I/O circuitry and the information is passed off to other elements (e.g. CPU) in the computer.

FIG. 7 illustrates the memory devices of this invention integrated into a standard computer architecture or computer system 200. The hardware of system 200 includes a processor (CPU) 205, a memory 206 (which can comprise molecular memory devices), a persistent storage 208 which does comprise molecular memory devices of this invention, and hardware for a graphical user interface (GUI) 220, coupled by a local bus or interface 210. The persistent memory 208 can include the elements shown in FIG. 11. System 200 can further include additional hardware components (not shown).

System 200 can be, for example, a personal computer or workstation. Processor 205 can be, for example, a microprocessor, such as the 80386, 80486 or Pentium(tm) microprocessor, made by Intel Corp. (Santa Clara, Calif.). Memory 206 can include, for example, random-access memory (RAM), read-only memory (ROM), virtual memory, molecular memory (FIG. 11) or any other working storage medium or media accessible by processor 205. Persistent storage 208 can include a hard disk, a floppy disk, an optical or magneto-optical disk, a molecular memory or any other persistent storage medium. GUI 220 facilitates communications between a user and system 200. Its hardware includes a visual display 221 and a selector device (mouse, keyboard, etc.) 222. Through visual display 221, system 200 can deliver graphical and textual output to the user. From selector device 222, system 200 can receive inputs indicating the user's selection of particular windows, menus, and menu items. Visual display 221 can include, for example, a cathode-ray tube (CRT) or flat-panel display screen, or a head-mounted display such as a virtual reality display. Selector device 222 can be, for example, a two-dimensional pointing device such as a mouse, a trackball, a track pad, a stylus, a joystick, or the like. Alternatively or additionally, selector device 222 can include a keyboard, such as an alphanumeric keyboard with function and cursor-control keys.

The software of system 200 includes an operating system 250 and an application program 260. The software of system 200 can further include additional application programs (not shown). Operating system 150 can be, for example, the Microsoft(r) Windows(.TM.) 95 operating system for IBM PC and compatible computers having or emulating Intel 80386, 80486, or Pentium(.TM.) processors. Alternatively, the operating system can be specialized for operation utilizing molecular memory elements. Application program 160 is any application compatible with the operating system and system 200 architecture. Persons of skill in the art will appreciate that a wide range of hardware and software configurations can support the system and method of the present invention in various specific embodiments.

Embodiment in a Programmed Information Appliance

Figure 8:
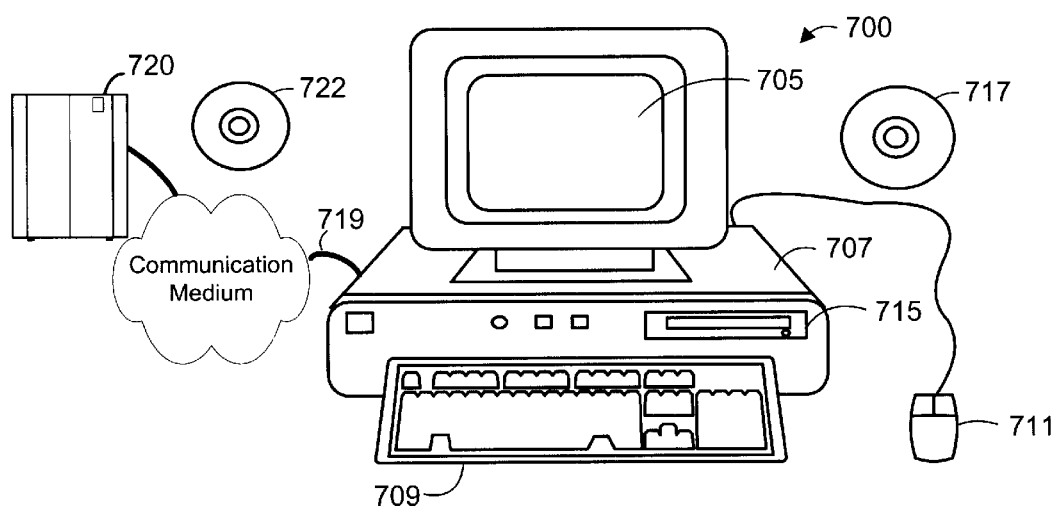
FIG. 8 is a block diagram showing a representative example logic device in which various aspects of the present invention may be embodied.

FIG. 8 is a block diagram showing a representative example logic device in which various aspects of the present invention may be embodied. As will be understood to practitioners in the art from the teachings provided herein, the invention can be implemented in hardware and/or software. In some embodiments of the invention, different aspects of the invention can be implemented in either client-side logic or server-side logic. As will be understood in the art, the invention or components thereof may be embodied in a fixed media program component containing logic instructions and/or data that when loaded into an appropriately configured computing device cause that device to perform according to the invention. As will be understood in the art, a fixed media containing logic instructions may be delivered to a viewer on a fixed media for physically loading into a viewer's computer or a fixed media containing logic instructions may reside on a remote server that a viewer accesses through a communication medium in order to download a program component.

FIG. 8 shows an information appliance (or digital device) 700 that may be understood as a logical apparatus that can read instructions from media 717 and/or network port 719, which can optionally be connected to server 720 having fixed media 722. Apparatus 700 can thereafter use those instructions to direct device logic, as understood in the art. One type of logical apparatus that may embody the invention is a computer system as illustrated in 700, containing CPU 707, optional input devices 709 and 711, disk drives 715 and optional monitor 705. Fixed media 717, or fixed media 722 over port 719, may be used to program such a system and may represent a disk-type optical or magnetic media, magnetic tape, solid state dynamic or static memory, etc. Communication port 719 may also be used to initially receive instructions that are used to program such a system and may represent any type of communication connection.

The invention also may be embodied in whole or in part within the circuitry of an application specific integrated circuit (ASIC) or a programmable logic device (PLD). In such a case, the invention may be embodied in a computer understandable descriptor language, which may be used to create an ASIC, or PLD that operates as herein described.

One particular advantage of specific embodiments of the present invention is that a FLASH memory based on one or more m-FETs of the present invention can allow data to be written or erased at relative low power, as low as two volts. Thus, the present invention can be embodied in an electronic device that operates at lower voltages. Such devices can include, but are not limited to, portable computers, hand-held devices such as personal digital assistants, or cellular phones. Common low-voltage digital devices operate at 5.0 volts or less, 3.3 volts or less, and 2.2 volts or less. The present invention, when embodied in such devices, allows for inclusion in low-voltage devices of reliable m-FET circuits.

Other Embodiments

The invention has now been described with reference to specific embodiments. Other embodiments will be apparent to those of skill in the art. In particular, an m-FET has generally been illustrated and described with reference with a particular and straight-forward transistor layout. However, it will be apparent to those of skill in the art that a CSM can be used for storage of charge in a variety of different FET transistor layouts, including all manner of FET architectures used for floating-gate operation and other architectures. Thus, although the present invention has been described in terms of various specific embodiments, it is not intended that the invention be limited to these embodiments. Modification within the spirit of the invention will be apparent to those skilled in the art. It is understood that the examples and embodiments described herein are for illustrative purposes and that various modifications or changes in light thereof will be suggested by the teachings herein to persons skilled in the art and are to be included within the spirit and purview of this application and scope of the claims.

All publications, patents, and patent applications cited herein or filed with this application, including any references filed as part of an Information Disclosure Statement, are incorporated by reference in their entirety.

What is claimed:

1. A charge storage transistor comprising:

a substrate comprising a channel region;

a source and a drain in electrical contact with said channel region, such that current can flow between said source and said drain through said channel region and affected by the conductance of said channel region;

one or more charge storage molecules covalently bonded proximate to said channel region such that charge transfer can occur between said charge storage molecules and said channel region, wherein charge stored on said molecules affects the conductance of said channel region; and a gate proximate to said one or more charge storage molecules such that a voltage between said gate and said source or said drain will cause charge stored on said charge storage molecules to flow to said channel region.

2. The transistor of claim 1 further wherein:

said one or more charge storage molecules comprise redox-active molecules, and said one or more charge storage molecules are attached to said channel region.

3. The transistor of claim 1 further wherein:

said one or more charge storage molecules are embedded in an electrolyte, and said electrolyte is positioned above said channel region.

4. The transistor of claim 1 further wherein:

said one or more charge storage molecules are attached to one or more distal shielding groups, and said distal shielding groups alter an electrolyte-molecule dipole capacitance of said one or more charge storage molecules.

5. The transistor of claim 1 further wherein:

said one or more charge storage molecules are attached to a linker; and said linker is attached to said channel region.

6. The transistor of claim 1 further wherein:

said one or more charge storage molecules are embedded in an electrolyte, said electrolyte is positioned above said channel region, and a channel spacer is positioned between said charge storage molecules and said gate.

7. The transistor of claim 1 further wherein said transistor can be used as a memory element by placing charge on said one or more charge storage molecules using a voltage applied to said gate, said charge retained on said one or more charge storage molecules after voltage is removed from said gate.

8. The transistor of claim 7 further wherein charge on said one or more charge storage molecules can be detected by altering a source/drain current and detecting a resulting source/drain voltage.

9. The transistor of claim 7 further wherein charge on said one or more charge storage molecules can be detected by altering a source/drain voltage and detecting a resulting source/drain current.

10. The transistor of claim 7 further comprising:

detecting a charge field imaged into said channel region from said one or more charge storage molecules without transferring any charge from said one or more charge storage molecules.

11. The transistor of claim 1 further wherein charge can be stored on said one or more charge storage molecules in a plurality of discrete charged states, said levels depending on voltage applied at said gate.

12. The transistor of claim 11 further wherein charge can be stored in said plurality of discrete charged states at room temperature.

13. The transistor of claim 11 further wherein charge can be stored in said plurality of discrete charged states using low voltages applied at said gate.

14. The transistor of claim 13 further wherein charge can be stored in said plurality of discrete charged states using gate/source or gate/drain voltages less than about 2 Volts.

15. The transistor of claim 13 further wherein charge can be stored in said plurality of discrete charged states using gate/source or gate/drain voltages less than about 3.3 Volts.

16. The transistor of claim 13 further wherein charge can be stored in said plurality of discrete charged states using gate/source or gate/drain voltages less than about 5.0 Volts.

17. The transistor of claim 11 further wherein said transistor can be used as a multi-bit memory element by placing charge on said one or more charge storage molecules in said plurality of discrete charged states, said charge retained at a quantized charge level on said one or more charge storage molecules after voltage is removed from said gate.

18. The transistor of claim 1 further wherein said one or more charge storage molecules exhibit robust and reproducible self-assembly on substrate surfaces such as silicon.

19. The transistor of claim 11 further wherein said transistor exhibits multilevel charge storage with inherent self-convergence, wherein because charge storage is discrete, there is no overwriting or overerasing.

20. The transistor of claim 6 further wherein:

charge can be stored on said one or more charge storage molecules in a plurality of discrete charged states;

said levels depending on voltage applied at said gate;

retention of charge is proportional to a linker length; and said length can be tuned to provide a desired retention.

21. The device according to claim 20 wherein write and read times are inversely proportional to linker length.

22. The device according to claim 20 wherein optimization of read/write times can be attained by adjusting linker length.

23. The transistor of claim 6 further wherein said one or more charge storage molecules are attached to said channel region via a linker bearing a sulfur atom.

24. The transistor of claim 6 further wherein said one or more charge storage molecules are attached to said channel region via a linker bearing an oxygen atom.

25. The transistor of claim 1 further wherein said one or more charge storage molecules are selected from the group consisting of porphyrinic macrocycle(s), metallocene(s), linear polyene(s), cyclic polyene(s), heteroatom-substituted linear polyene(s), heteroatom-substituted cyclic polyene(s), tetrathiafulvalene(s), tetraselenafulvalene(s), metal coordination complex(es), buckyball(s), triarylamine(s), 1,4-phenylenediamine(s), xanthene(s), flavin(s), phenazine(s), phenothiazine(s), acridine(s), quinoline(s), 2,2'-bipyridyl(s), 4,4'-bipyridyl(s), tetrathiotetracene(s), and peri-bridged naphthalene dichalcogenide(s).

26. The transistor of claim 1 further wherein said one or more charge storage molecules are selected from the group consisting of porphyrin(s), expanded porphyrin(s), contracted porphyrin(s), ferrocene(s), linear porphyrin polymer(s), porphyrinic sandwich complex(es), and porphyrin arrays.

27. The transistor of claim 1 further wherein said one or more charge storage molecules comprise one or more porphyrinic macrocycle(s) substituted at a $\beta$- position or at a meso- position.

* * * * *